(12) United States Patent
Qing et al.

(10) Patent No.: US 12,402,513 B2
(45) Date of Patent: Aug. 26, 2025

(54) DISPLAY SUBSTRATE AND PREPARATION METHOD THEREFOR, DISPLAY DEVICE, AND COLOR FILTER SUBSTRATE

(71) Applicants: Chengdu BOE Optoelectronics Technology Co., Ltd., Sichuan (CN); BOE Technology Group Co., Ltd., Beijing (CN)

(72) Inventors: Wanmei Qing, Beijing (CN); Baiqiang Wang, Beijing (CN); Chao Kong, Beijing (CN); Wei Zhang, Beijing (CN); Lingjun Dai, Beijing (CN); Tiancheng Yu, Beijing (CN); Zhen Sun, Beijing (CN); Zidi Yan, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/637,457

(22) PCT Filed: Mar. 22, 2021

(86) PCT No.: PCT/CN2021/082050
§ 371 (c)(1),
(2) Date: Feb. 23, 2022

(87) PCT Pub. No.: WO2022/198374
PCT Pub. Date: Sep. 29, 2022

(65) Prior Publication Data
US 2024/0122047 A1 Apr. 11, 2024

(51) Int. Cl.
*H10K 59/12* (2023.01)
*H10K 59/38* (2023.01)
(Continued)

(52) U.S. Cl.
CPC ......... *H10K 59/80* (2023.02); *H10K 59/1201* (2023.02); *H10K 59/38* (2023.02);
(Continued)

(58) Field of Classification Search
CPC ........ H10K 59/12; H10K 59/38; H10K 59/80; H10K 59/1201; H10K 59/879;
(Continued)

(56) References Cited

U.S. PATENT DOCUMENTS

2015/0085384 A1* 3/2015 Choi ..................... G02B 1/002
977/773
2015/0129851 A1 5/2015 Lee et al.
(Continued)

FOREIGN PATENT DOCUMENTS

CN 103072940 A 5/2013
CN 104112764 A 10/2014
(Continued)

OTHER PUBLICATIONS

Xinglin Wang et al., Lateral shifts of transmission light from slab structure with negative-zero-positive index metamaterial, Chinese Journal of Quantum Electronics, May 2015, vol. 32 No. 3: 257-262.
(Continued)

*Primary Examiner* — Chuong A Luu
(74) *Attorney, Agent, or Firm* — Ling Wu; Stephen Yang; Ling and Yang Intellectual Property

(57) ABSTRACT

A display substrate includes an underlying substrate, a display structure layer arranged on the underlying substrate, and a light regulation layer arranged at a light exiting side of the display structure layer. The display structure layer includes multiple sub-pixels. An orthographic projection of the light regulation layer on the underlying substrate does not overlap with opening regions of the multiple sub-pixels. The light regulation layer is configured to adjust an emergent
(Continued)

direction of light of at least one color emitted from the display structure layer.

19 Claims, 10 Drawing Sheets

(51) Int. Cl.
*H10K 59/80* (2023.01)
*G02B 5/20* (2006.01)

(52) U.S. Cl.
CPC ............ *G02B 5/201* (2013.01); *H10K 59/879* (2023.02); *H10K 59/8792* (2023.02)

(58) Field of Classification Search
CPC .. H10K 59/8792; H10K 59/35; H10K 59/121; H10K 59/122; H10K 59/1213; H10K 59/878; H10K 50/86; H10K 50/805; H10K 50/842; H10K 50/844; H10K 50/856; H10K 50/858; H10K 50/865; H10K 50/8426; G02B 5/20; G02B 5/201
USPC .......................................................... 257/91
See application file for complete search history.

(56) References Cited

U.S. PATENT DOCUMENTS

| | | |
|---|---|---|
| 2016/0254483 A1 | 9/2016 | Wang |
| 2019/0056618 A1 | 2/2019 | Xu |
| 2019/0384181 A1 | 12/2019 | Ahmed et al. |
| 2020/0033671 A1 | 1/2020 | Wang et al. |
| 2021/0335891 A1 | 10/2021 | Li |
| 2021/0351381 A1 | 11/2021 | Cai et al. |

FOREIGN PATENT DOCUMENTS

| | | |
|---|---|---|
| CN | 107255885 A | 10/2017 |
| CN | 108919402 A | 11/2018 |
| CN | 110416247 A | 11/2019 |
| CN | 110707146 A | 1/2020 |
| CN | 110718644 A | 1/2020 |
| CN | 111668384 A | 9/2020 |

OTHER PUBLICATIONS

Jason Valentine et al., Three-dimensional optical metamaterial with a negative refractive index, Nature, Sep. 18, 2008, vol. 455: 376-380.

* cited by examiner (a)

(b)

DISPLAY SUBSTRATE AND PREPARATION METHOD THEREFOR, DISPLAY DEVICE, AND COLOR FILTER SUBSTRATE

CROSS-REFERENCE TO RELATED APPLICATION

The present application is a U.S. National Phase Entry of International Application PCT/CN2021/082050 having an international filing date of Mar. 22, 2021. The entire contents of the above-identified application are hereby incorporated by reference.

TECHNICAL FIELD

The present disclosure relates to, but is not limited to, the technical field of display, and in particular to a display substrate, a method for preparing the display substrate, a display apparatus, and a color film substrate.

BACKGROUND

As an active display device, an Organic Light Emitting Diode (OLED) has advantages such as self-luminescence, wide view angle, high contrast, low power consumption, extremely quick response, etc. With constant development of display technology, a display apparatus using an OLED as a light-emitting device and performing signal control by use of a Thin Film Transistor (TFT) has become a mainstream product in the field of display at present.

SUMMARY

The following is a summary of subject matters described in the present disclosure in detail. The summary is not intended to limit the scope of protection of the claims.

Embodiments of the present disclosure provide a display substrate, a method for preparing the display substrate, a display apparatus, and a color film substrate.

In an aspect, an embodiment of the present disclosure provides a display substrate, which includes an underlaying substrate, a display structure layer arranged on the underlaying substrate, and a light regulation layer arranged at a light exiting side of the display structure layer. The display structure layer includes multiple sub-pixels. An orthographic projection of the light regulation layer on the underlaying substrate does not overlap with opening regions of the multiple sub-pixels. The light regulation layer is configured to adjust an emergent direction of light of at least one color emitted from the display structure layer.

In some exemplary implementation modes, the display structure layer further includes a color filter layer located at a light exiting side of the multiple sub-pixels. The color filter layer includes a black matrix and multiple color filter units which are periodically arranged, the black matrix is located between adjacent color filter units. The light regulation layer is located at a side of the black matrix away from the underlaying substrate.

In some exemplary implementation modes, an orthogonal projection of the black matrix on the underlaying substrate covers an orthogonal projection of the light regulation layer on the underlaying substrate.

In some exemplary implementation modes, the light regulation layer includes at least one light regulation portion. The at least one light regulation portion is located on at least one side of at least one of the color filter units.

In some exemplary implementation modes, a brightness ratio of light of different colors of the display substrate at a target view angle is adjusted by at least one of the following: a distance from the light regulation portion to a corresponding sub-pixel, a first length of the light regulation portion, and a second length of the light regulation portion. The first length is a size of the light regulation portion in a first direction, wherein the first direction is perpendicular to a plane where the display substrate is located. The second length is a size of the light regulation portion in a second direction, wherein the second direction is parallel to the plane where the display substrate is located and intersected with a centerline of the sub-pixel corresponding to the light regulation portion.

In some exemplary implementation modes, the first length of the light regulation portion is less than or equal to $h_0$, $h_0 = d_0/\tan\theta$, where $d_0$ represents a vertical distance from the light regulation portion to the centerline of the corresponding sub-pixel, and $\theta$ represents a squint angle.

In some exemplary implementation modes, the second length of the light regulation portion is larger than or equal to a critical width D, $$D = \frac{d_0}{\tan\theta \tan\left\{\arcsin\left[\frac{n_1}{n_2}\sin\left(\frac{\pi}{2} - \theta\right)\right]\right\}},$$

where $d_0$ represents a vertical distance from the light regulation portion to the centerline of the corresponding sub-pixel, $\theta$ represents a squint angle, $n_1$ represents a refractive index of a first medium, and $n_2$ represents a refractive index of the light regulation portion.

In some exemplary implementation modes, the vertical distance from the light regulation portion to the centerline of the corresponding sub-pixel is $d_0 = a_1/2 + d$, where $a_1$ represents a size of the sub-pixel corresponding to the light regulation portion, and d represents a distance from the light regulation portion to the corresponding sub-pixel, and d is larger than 0 and smaller than a difference between a distance between adjacent sub-pixels and a second length of a light regulation portion between the adjacent sub-pixels.

In some exemplary implementation modes, in a plane crossing the centerline of the sub-pixel corresponding to the light regulation portion and perpendicular to the underlaying substrate, a section of the light regulation portion is a rectangle, or, a second length of a bottom of the light regulation portion is larger than a second length of a top of the light regulation portion.

In some exemplary implementation modes, the color filter layer includes a first color filter unit, a second color filter unit and a third color filter unit which are periodically arranged. The light regulation layer includes at least one of the following: a first light regulation portion located at a side of the first color filter unit away from the second color filter unit, a fourth light regulation portion located at a side of the first color filter unit close to the second color filter unit, a second light regulation portion located at a side of the second color filter unit close to the first color filter unit, and a third light regulation portion located at a side of the second color filter unit close to the third color filter unit.

In some exemplary implementation modes, the second light regulation portion and the fourth light regulation portion form an integrated structure.

In some exemplary implementation modes, a second length of the integrated structure formed by the second light regulation portion and the fourth light regulation portion is larger than or equal to the maximum among a critical width of the second light regulation portion and a critical width of the fourth light regulation portion. The second length is a size of the light regulation portion in a second direction, wherein the second direction is parallel to a plane where the display substrate is located and intersected with a centerline of a sub-pixel corresponding to the light regulation portion.

In some exemplary implementation modes, the first color filter unit is a red filter unit, the second color filter unit is a green filter unit, and the third color filter unit is a blue filter unit. The first light regulation portion and the fourth light regulation portion are configured to adjust an emergent direction of first-color light emitted from the first color filter unit. The second light regulation portion and the third light regulation portion are configured to adjust an emergent direction of second-color light emitted from the second color filter unit. First lengths of the first light regulation portion and the fourth light regulation portion are larger than or equal to the first length of the second light regulation portion and also larger than or equal to that of the third light regulation portion. The first length is a size of the light regulation portion in a first direction, and the first direction is perpendicular to a plane where the display substrate is located.

In some exemplary implementation modes, the first lengths of the first light regulation portion and the fourth light regulation portion are about 0.7 microns to 1.2 microns. The first length of the second light regulation portion is about 0.1 microns to 0.5 microns. The first length of the third light regulation portion is about 0.01 microns to 0.3 microns.

In some exemplary implementation modes, second lengths of the first light regulation portion, the second light regulation portion, the third light regulation portion and the fourth light regulation portion are substantially the same. The second length is a size of a light regulation portion in a second direction, wherein the second direction is parallel to the plane where the display substrate is located and intersected with a centerline of a sub-pixel corresponding to the light regulation portion.

In some exemplary implementation modes, a material of the light regulation layer is a negative-refractive-index material.

In some exemplary implementation modes, a sub-pixel includes a light-emitting element and a driving circuit for driving the light-emitting element to emit light. The light-emitting element includes a first electrode, a second electrode, and an organic light-emitting layer arranged between the first electrode and the second electrode. The first electrode is located at a side of the second electrode close to the underlaying substrate. An inclination angle is formed between a plane where the first electrode is located and a plane where the underlaying substrate is located.

In another aspect, an embodiment of the present disclosure provides a display apparatus, which includes the above-mentioned display substrate.

In another aspect, an embodiment of the present disclosure provides a method for a preparing a display substrate, which is used for preparing the above-mentioned display substrate. The preparation method includes that: forming a display structure layer on an underlaying substrate; and forming a light regulation layer at a light exiting side of the display structure layer. The display structure layer includes multiple sub-pixels. An orthographic projection of the light regulation layer on the underlaying substrate does not overlap with opening regions of the multiple sub-pixels. The light regulation layer is configured to adjust an emergent direction of light of at least one color emitted from the display structure layer.

In another aspect, an embodiment of the present disclosure provides a color film substrate, which includes a base substrate, a color filter layer arranged on the base substrate, and a light regulation layer. The color filter layer includes a black matrix and multiple color filter units which are periodically arranged. The light regulation layer is arranged at a side of the black matrix away from the base substrate. The light regulation layer is configured to adjust an emergent direction of light of at least one color emitted from the color filter layer.

Other aspects will become apparent upon reading and understanding of the drawings and the detailed description.

BRIEF DESCRIPTION OF DRAWINGS

Accompanying drawings provide a further understanding of technical solutions of the present disclosure, constitute a part of the specification, and are used to explain the technical solutions of the present disclosure together with embodiments of the present disclosure, and not intended to form limitations on the technical solutions of the present disclosure. Shapes and sizes of one or more components in the drawings do not reflect actual scales, and are only intended to schematically describe the contents of the present disclosure.

DETAILED DESCRIPTION

Figure 1:
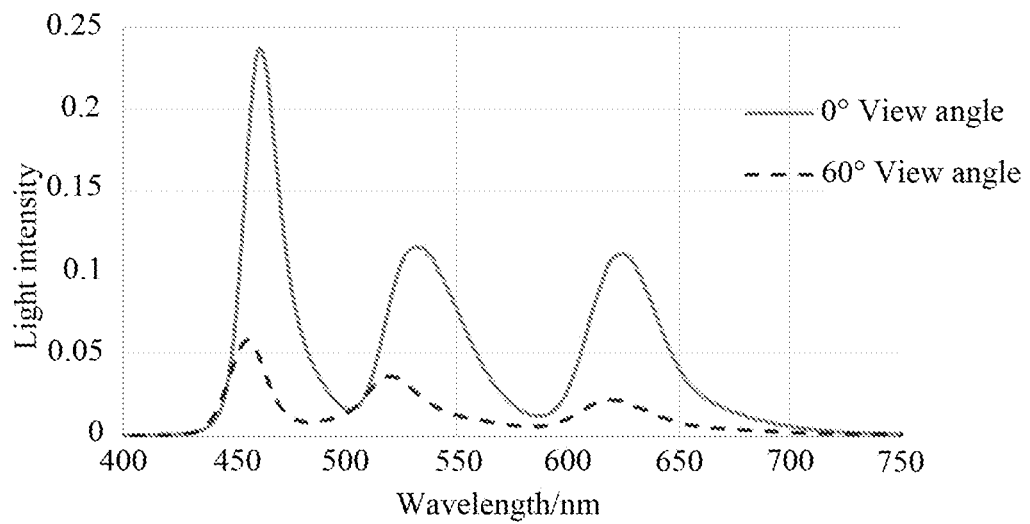
FIG. 1 is a schematic diagram of spectra of a display substrate at a view angle of 0° and a view angle of 60°.

Embodiments of the present disclosure will be described below with reference to the drawings in detail. The implementation modes may be implemented in various forms. Those of ordinary skills in the art may easily understand such a fact that implementation modes and contents may be transformed into one or more forms without departing from the purpose and scope of the present disclosure. Therefore, the present disclosure should not be construed as being limited to the contents recorded in the following implementation modes only. The embodiments in the present disclosure and the features in the embodiments may be randomly combined with each other if there is no conflict.

In the drawings, size/sizes of one or more constituent elements, thicknesses of layers, or regions are sometimes exaggerated for clarity. Therefore, an implementation mode of the present disclosure is not necessarily limited to the shapes and sizes of components in the drawings do not reflect actual scales. In addition, the drawings schematically illustrate ideal examples, and an implementation mode of the present disclosure is not limited to the shapes, numerical values, or the like shown in the drawings.

Ordinal numerals such as "first", "second" and "third" in the present disclosure are set to avoid confusion between constituent elements instead of forming limitations on numbers. In the present disclosure, "a plurality of/multiple" includes a quantity of two or more than two.

In the present disclosure, sometimes for convenience, wordings "central", "up", "down", "front", "back", "vertical", "horizontal", "top", "bottom", "inside", "outside" and the like indicating directional or positional relationships are used to illustrate positional relationships between constituent elements with reference to the drawings. These terms are not intended to indicate or imply that involved devices or elements must have specific orientations and be structured and operated in the specific orientations but only to facilitate describing the present specification and simplify the description, and thus should not be understood as limitations on the present disclosure. The positional relationships between the constituent elements may be changed as appropriate based on the directions according to which the constituent elements are described. Therefore, appropriate replacements based on situations are allowed, which are not limited to the wordings in the specification.

In the present disclosure, unless otherwise specified and defined, terms "mounting", "mutual connection" and "connection" should be understood in a broad sense. For example, the terms may be fixed connection, or detachable connection or integration connection. Alternatively, the term may be mechanical connection or electric connection. Alternatively, the term may be direct connection, or indirect connection through an intermediate, or internal communication between two elements. Those of ordinary skills in the art may understand the meanings of the above terms in the present disclosure according to situations.

In the present disclosure, a transistor refers to an element at least including three terminals, i.e., a gate electrode, a drain electrode, and a source electrode. The transistor has a channel region between the drain electrode (drain electrode terminal, drain region, or drain electrode) and the source electrode (source electrode terminal, source region, or source electrode), and a current can flow through the drain electrode, the channel region, and the source region. In the present disclosure, the channel region refers to a region through which the current mainly flows. In a case that transistors with opposite polarities are used, or a current direction changes during operation of a circuit, or the like, functions of the "source electrode" and the "drain electrode" are sometimes interchangeable. Therefore, the "source electrode" and the "drain electrode" are interchangeable in the present disclosure.

In the present disclosure, "electric connection" includes a case where constituent elements are connected through an element with a certain electrical action. The "element with the certain electrical action" is not particularly limited as long as electric signals between the connected constituent elements can be sent and received. Examples of "the element with the certain electrical action" not only include electrodes and wirings, but also include switching elements such as transistors, resistors, inductors, capacitors, other elements with one or more functions, etc.

In the present disclosure, "parallel" refers to a state in which an angle formed by two straight lines is above −10° and below 10°, and thus may include a state in which the angle is above −5° and below 5°. In addition, "perpendicular" refers to a state that an angle formed by two straight lines is above 80° and below 100°, and thus may include a state that the angle is above 85° and below 95°.

In the present disclosure, "film" and "layer" are interchangeable. For example, a "conductive layer" may sometimes be replaced with a "conductive film". Similarly, an "insulating film" may sometimes be replaced with an "insulating layer".

In the present disclosure, "about" and "approximate" refer to a case that a boundary is defined not so strictly and process and measurement error within ranges are allowed.

At present, an OLED display substrate improves light-emitting efficiency and color purity for image displaying by use of a microcavity effect. The microcavity effect refers to that light emitted from an organic Electro-Luminescence (EL) layer is repeatedly selectively reflected between specific layers and transmitted through a first electrode layer or a second electrode layer with increased optical strength, thereby improving the brightness and color purity of finally output light. However, due to existence of the microcavity effect, light in the OLED display substrate may be subjected to effects of interference superimposition and interference cancellation, which brings the problem of view angle color shift to the OLED display substrate.

FIG. 1 is a schematic diagram of spectra of a display substrate at a view angle of 0° (i.e., a front view angle) and a view angle of 60°. As shown in FIG. 1, Red Green Blue (RGB) spectral intensities at the view angle of 60° are all lower than those at the view angle of 0°. Red light intensity and blue light intensity are reduced relatively faster, and the RGB spectra at the view angle of 60° has a blue shift compared with the RGB spectra at the front view angle. Therefore, a brightness ratio of RGB for compositing white light at the view angle of 60° is different from a brightness ratio of RGB for compositing white light at the front view angle. As a manifestation, an image of the OLED display substrate is abnormal at the view angle of 60°, and is in a bluish or yellowish abnormal state.

Figure 2:
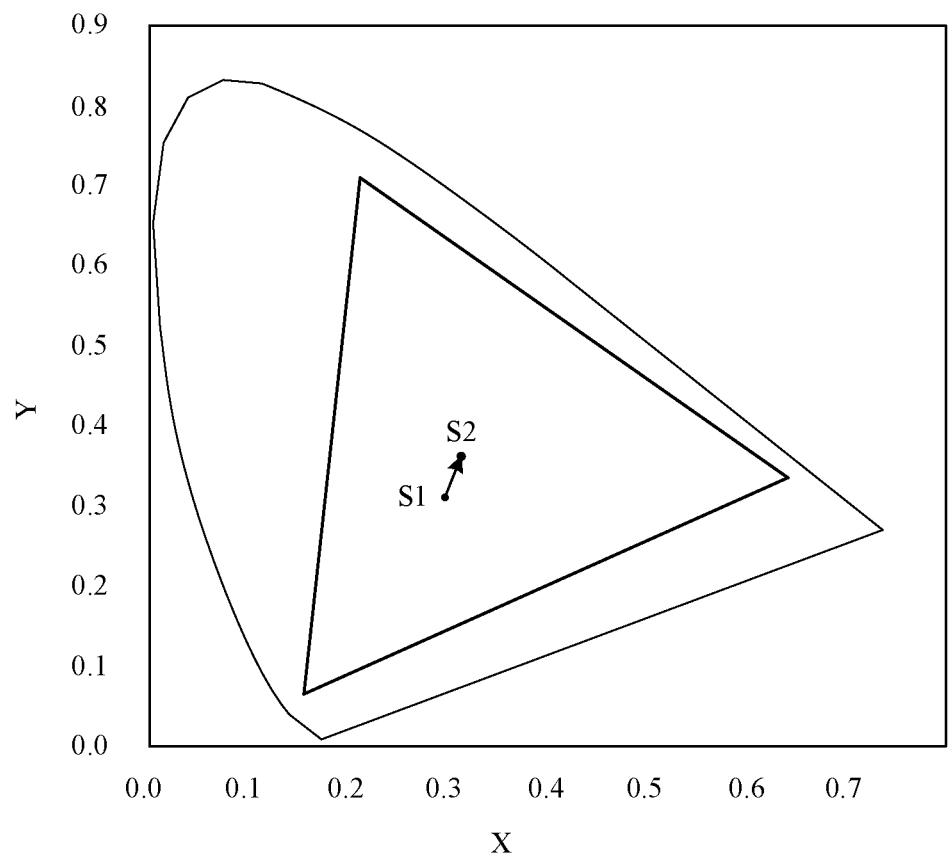
FIG. 2 is a schematic diagram of a yellow shift of a display substrate at a squint angle.

FIG. 2 is a schematic diagram of a yellow shift of a display substrate at a squint angle (i.e., a non -0° view angle). FIG. 2 is a CIE (International Commission on illumination) 1931 chromaticity diagram, chromaticity coordinates in the X axis represents a proportion of red primary, and chromaticity coordinates in the Y axis represents a proportion of green primary. As shown in FIG. 2, composition of white light at a front view angle corresponds to point S1, and composition of white light at a squint angle (for example, larger than the view angle of) 60° corresponds to point S2. It can be seen from FIG. 2 that, compared with the case at the front view angle, the display substrate has a phenomenon of yellow shift at the squint angle.

At least one embodiment of the present disclosure provides a display substrate, which includes an underlaying substrate, a display structure layer arranged on the underlaying substrate, and a light regulation layer arranged at a light exiting side of the display structure layer. The display structure layer includes multiple sub-pixels. An orthographic projection of the light regulation layer on the underlaying substrate does not overlap with opening regions of the multiple sub-pixels. The light regulation layer is configured to adjust an emergent direction of light of at least one color emitted from the display structure layer.

According to the display substrate provided in this embodiment, a emergent direction of light of at least one color may be adjusted by the light regulation layer arranged at the light exiting side of the display structure layer. A light path is changed to control a light intensity of light of different colors entering human eyes to further improve a view angle color shift of the display substrate.

In some exemplary implementation modes, the light regulation layer is configured to adjust an emergent direction of light of at least one of the following colors emitted from the display structure layer: red, green, and blue. For example, the light regulation layer adjusts an emergent direction of red light only, or adjusts an emergent direction of green light only, or adjusts an emergent direction of blue light only, or adjusts emergent directions of light of at least two colors among red light, green light, and blue light. However, no limits are made thereto in this embodiment.

In some exemplary implementation modes, the display structure layer further includes a color filter layer located at a light exiting side of the multiple sub-pixels. The color filter layer includes a black matrix and multiple color filter units which are periodically arranged, and the black matrix is located between adjacent color filter units. The light regulation layer is located at a side of the black matrix away from the underlaying substrate. In some examples, the multiple color filter units may be in one-to-one correspondence with the multiple sub-pixels. An orthographic projection of the color filter units on the underlaying substrate covers opening regions of corresponding sub-pixels. An orthographic projection of the black matrix on the underlaying substrate covers an orthographic projection of the light regulation layer on the underlaying substrate. The orthographic projection of the color filter units does not overlap with the orthographic projection of the light regulation layer on the underlaying substrate. In some examples, the display substrate may be a display substrate of a Color Filter (CF) on Encapsulation (COE) structure (the color filter layer is formed on an organic electro-luminescence device obtained by thin film encapsulation). However, no limits are made thereto in this embodiment.

In some exemplary implementation modes, the light regulation layer includes at least one light regulation portion. The at least one light regulation portion is located on at least one side of at least one color filter unit. In some examples, the at least one light regulation portion may be arranged on a periphery of at least one color filter unit. For example, the at least one light regulation portion may be located at a side or two opposite sides of or around the color filter units. In some examples, the light regulation layer includes multiple light regulation portions. The multiple light regulation portions may be independent of one another. Alternatively, part of light regulation portions may be mutually connected to form an integrated structure. Alternatively, all of the light regulation portions are mutually connected to form an integrated structure. However, no limits are made thereto in this embodiment.

In some exemplary implementation modes, a brightness proportion of light of different colors of the display substrate at a target view angle may be adjusted by at least one of the following: a distance from a light regulation portion to a corresponding sub-pixel, a first length of the light regulation portion, and a second length of the light regulation portion. The first length is a size of the light regulation portion in a first direction, wherein the first direction is perpendicular to a plane where the display substrate is located. The second length is a size of the light regulation portion in a second direction, wherein the second direction is parallel to the plane where the display substrate is located and intersected with a centerline of the sub-pixel corresponding to the light regulation portion. In the present disclosure, the first length may be referred to as a thickness or height, and the second length may be referred to as a width. In some examples, the distance from the light regulation portion to the corresponding sub-pixel may be a vertical distance between an edge of the light regulation portion close to the corresponding sub-pixel and an edge of the opening region of the sub-pixel close to the light regulation portion.

In some examples, distances from the light regulation portions to corresponding sub-pixels may be adjusted to adjust brightness ratios of light of different colors of the display substrate at a target view angle, thereby improving the view angle color shift. For example, the distances from the light regulation portions to the corresponding sub-pixels are adjusted to adjust a brightness ratio of RGB in case of view angle color shift to a best brightness ratio at the target view angle. Herein, sizes (including first lengths and second lengths) of different light regulation portions may be the same. However, no limits are made thereto in this embodiment.

In some examples, the first lengths and the second lengths of the light regulation portions may be adjusted to adjust brightness ratios of light of different colors of the display substrate at a target view angle, thereby improving the view angle color shift. For example, a second length of a light regulation portion is determined according to the target view angle and a vertical distance from the light regulation portion to a centerline of the corresponding sub-pixel. Adjustment factors for the light of the different colors are determined according to a brightness ratio of RGB in case of a view angle color shift and a best brightness ratio taken as an adjustment target. The first length of the light regulation portion is determined based on the adjustment factors, so as to achieve the best brightness ratio at the target view angle.

In some examples, distances from the light regulation portions to the corresponding sub-pixels and the first lengths and the second lengths of the light regulation portions may be adjusted to adjust brightness ratios of light of different colors of the display substrate at a target view angle, thereby improving the view angle color shift. For example, for one light regulation portion, a second length of the light regulation portion is determined according to the target view angle and a vertical distance from the light regulation portion to a centerline of a corresponding sub-pixel. Adjustment factors for the light of the different colors are determined according to a brightness ratio of RGB in case of a color shift at a left-side view angle and a best brightness ratio taken as an adjustment target. A first length of the light regulation portion is determined based on the adjustment factors, so as to achieve a best brightness ratio at the left-side view angle. Sizes of other light regulation portions are set to be the same as a size (including the first length and the second length) of the above-mentioned light regulation portion. Distances from the other light regulation portions to corresponding sub-pixels are adjusted to adjust a brightness ratio of RGB in case of a color shift at a right-side view angle to a best brightness ratio at the target view angle.

In some exemplary implementation modes, the first length of the light regulation portion is less than or equal to $h_0$, $h_0 - d_0/\tan\theta$, wherein $d_0$ represents a vertical distance from the light regulation portion to the centerline of the corresponding sub-pixel, and $\theta$ represents a squint angle.

In some exemplary implementation modes, the second length of the light regulation portion is larger than or equal to a critical width D, $$D = \frac{d_0}{\tan\theta \tan\left\{\arcsin\left[\frac{n_1}{n_2}\sin\left(\frac{\pi}{2} - \theta\right)\right]\right\}};$$

wherein do represents the vertical distance from the light regulation portion to the centerline of the corresponding sub-pixel, $\theta$ represents the squint angle, $n_1$ represents a refractive index of a first medium, and $n_2$ represents a refractive index of the light regulation portion. The first medium is a medium through which light passes before entering the light regulation portion.

In some exemplary implementation modes, the vertical distance from the light regulation portion to the centerline of the corresponding sub-pixel is $d_0 = a_1/2 + d$, wherein $a_1$ represents a size of the sub-pixel corresponding to the light regulation portion, and d represents a distance from the light regulation portion to the corresponding sub-pixel, and d is larger than 0 and smaller than a difference between a distance between adjacent sub-pixels and a second length of a light regulation portion between the adjacent sub-pixels. In this example, the size of the sub-pixel corresponding to the light regulation portion may refer to a size of an opening region of the sub-pixel corresponding to the light regulation portion.

In some exemplary implementation modes, in a plane crossing the centerline of the sub-pixel corresponding to the light regulation portion and perpendicular to the underlaying substrate, a section of the light regulation portion is a rectangle, or, a second length of a bottom of the light regulation portion is larger than a second length of a top of the light regulation portion. In some examples, a section of the light regulation portion is a rectangle. In such case, a height of the light regulation portion may be less than or equal to $h_0$, and a width of the light regulation portion may be larger than or equal to D. In some examples, the section of the light regulation portion may be a non-rectangle. In such case, a second length of a bottom of the light regulation portion is larger than a second length of a top of the light regulation portion, and a second length of a portion between the bottom and the top may change, for example, decreases gradually or progressively decreases at first and then increases. For example, the section of the light regulation portion may be a trapezoid, a triangle, or in a structure with a cambered top surface (for example, the top surface is a convex surface or a concave surface). A maximum height of the light regulation portion may be less than or equal to $h_0$, and a minimum width of the light regulation portion may be larger than or equal to D. For example, when the section of the light regulation portion is a trapezoid, a height of the trapezoid may be less than or equal to $h_0$, and a length of an upper edge of the trapezoid (i.e., a second length of the top) may be larger than or equal to D. For example, when the section of the light regulation portion is a triangle, a maximum height of the triangle may be less than or equal to $h_0$, and a minimum width of the triangle may be larger than or equal to D. However, no limits are made thereto in this embodiment.

In some exemplary implementation modes, the color filter layer may include a first color filter unit, a second color filter unit and a third color filter unit which are periodically arranged. The light regulation layer may include at least one of a first light regulation portion located at a side of the first color filter unit away from the second color filter unit, a fourth light regulation portion located at a side of the first color filter unit close to the second color filter unit, a second light regulation portion located at a side of the second color filter unit close to the first color filter unit, and a third light regulation portion located at a side of the second color filter unit close to the third color filter unit. However, no limits are made thereto in this embodiment.

In some exemplary implementation modes, the second light regulation portion and the fourth light regulation portion may form an integrated structure. Both the second light regulation portion and the fourth light regulation portion are located between the first color filter unit and the second color filter unit. However, no limits are made thereto in this embodiment.

In some exemplary implementation modes, a second length of the integrated structure formed by the second light regulation portion and the fourth light regulation portion is larger than or equal to the maximum among a critical width of the second light regulation portion and a critical width of the fourth light regulation portion. For example, when the critical width of the second light regulation portion is larger than the critical width of the fourth light regulation portion, the second length of the integrated structure formed by the second light regulation portion and the fourth light regulation portion is larger than or equal to the critical width of the second light regulation portion. However, no limits are made thereto in this embodiment.

In some exemplary implementation modes, the first color filter unit is a red filter unit, the second color filter unit is a green filter unit, and the third color filter unit is a blue filter unit. The first light regulation portion and the fourth light regulation portion are configured to adjust an emergent direction of first-color light emitted from the first color filter unit. The second light regulation portion and the third light regulation portion are configured to adjust an emergent direction of second-color light emitted from the second color filter unit. First lengths of the first light regulation portion and the fourth light regulation portion are larger than or equal to a first length of the second light regulation portion and larger than or equal to a first length of the third light regulation portion. In other words, a first length of a light regulation portion adjusting the emergent direction of the first-color light is larger than or equal to a first length of a light regulation portion adjusting the emergent direction of the second-color light. In some examples, the first light regulation portion and the fourth light regulation portion are located at two opposite sides of the first color filter unit. The second light regulation portion and the third light regulation portion are located at two opposite sides of the second color filter unit. However, no limits are made thereto in this embodiment.

In some exemplary implementation modes, the first lengths of the first light regulation portion and the fourth light regulation portion are about from 0.7 microns to 1.2 microns. The first length of the second light regulation portion is about from 0.1 microns to 0.5 microns. The first length of the third light regulation portion is about from 0.01 microns to 0.3 microns. The light regulation layer provided in this exemplary implementation mode may improve a color shift at a squint angle of more than or equal to 60°.

In some exemplary implementation modes, second lengths of the first light regulation portion, the second light regulation portion, the third light regulation portion and the fourth light regulation portion are approximately the same. However, no limits are made thereto in this embodiment. For example, the second lengths of the first light regulation portion, the second light regulation portion, the third light regulation portion and the fourth light regulation portion may be different from one another or partially the same. The second lengths of different light regulation portions need to be larger than or equal to corresponding critical widths.

In some exemplary implementation modes, a material of the light regulation layer is a negative-refractive-index material. For example, the material of the light regulation layer may include at least one of a photonic crystal material and a dual-dielectric negative-refractive-index material. However, no limits are made thereto in this embodiment.

In some exemplary implementation modes, a sub-pixel includes a light-emitting element and a driving circuit for driving the light-emitting element to emit light. The light-emitting element includes a first electrode, a second electrode, and an organic light-emitting layer arranged between the first electrode and the second electrode. The first electrode is located at a side of the second electrode close to the underlaying substrate. An inclination angle is formed between a plane where the first electrode is located and a plane where the underlaying substrate is located. In some examples, different inclination angles are formed between planes where first electrodes of different sub-pixels are located and the plane where the underlaying substrate is located. In some examples, an orthographic projection of a light regulation portion corresponding to a sub-pixel on the underlaying substrate may be located at a side facing an inclination angle of a first electrode of the sub-pixel. For example, a right side of a first electrode of a sub-pixel is raised to form an inclination angle between the plane where the first electrode is located and the plane where the underlaying substrate is located, and an orthographic projection of a light regulation portion corresponding to the sub-pixel on the underlaying substrate may be located at a left side of the sub-pixel. However, no limits are made thereto in this embodiment. According to the display substrate of this exemplary implementation mode, the case that single-color proportions for compositing white light at different view angles are greatly different due to existence of the inclination angles of the first electrodes and thus brightness (luminance) decays (L-Decays) are asymmetric in two view angle directions (positive and negative) may be improved, and the resulting view angle color shift is further improved.

The display substrate of this embodiment will be described with several examples. The display substrate is described in the following examples all by taking an OLED display substrate with a top-emission structure as an example. The light exiting side of the display structure layer is away from the underlaying substrate. However, no limits are made thereto in this embodiment. For example, the display substrate may be an OLED display substrate with a bottom-emission structure. The light exiting side of the display structure layer is close to the underlaying substrate.

In some exemplary implementation modes, the display substrate may include a display region and a non-display region located on a periphery of the display region. Multiple pixel units may be arranged regularly in the display region. At least one of the multiple pixel units includes multiple sub-pixels, for example, including a first sub-pixel emitting first-color light, a second sub-pixel emitting second-color light, and a third sub-pixel emitting third-color light. However, no limits are made thereto in this embodiment. For example, at least one pixel unit may include a red sub-pixel, a green sub-pixel, a blue sub-pixel, and a white sub-pixel. At least one sub-pixel includes a light-emitting element and a pixel driving circuit for driving the light-emitting element to emit light. The pixel driving circuit in the at least one sub-pixel is connected with a scanning signal line, a data signal line, and a light-emitting signal line respectively. The pixel driving circuit is configured to receive a data voltage transmitted by the data signal line and output a corresponding current to the corresponding light-emitting element under control of the scanning signal line and the light-emitting signal line. The light-emitting element in the at least one sub-pixel is connected with the corresponding pixel driving circuit. The light-emitting element is configured to emit light of corresponding brightness in response to a current output by the pixel driving circuit of the corresponding sub-pixel.

Figure 3:
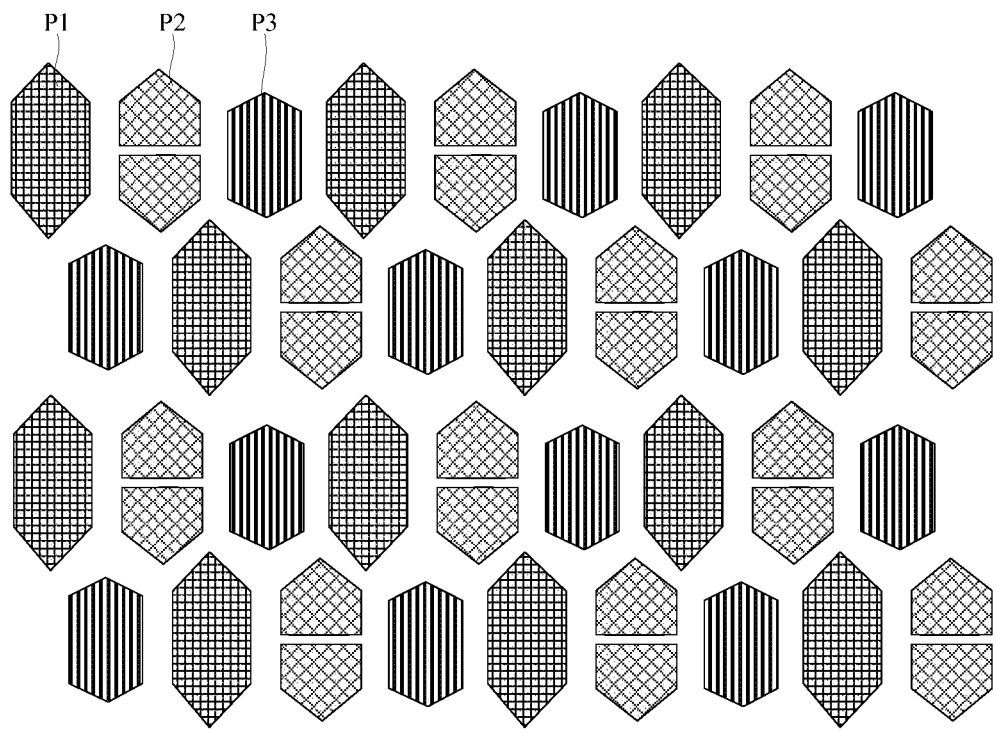
FIG. 3 is a schematic plan view of a structure of multiple sub-pixels in a display region according to at least one embodiment of the present disclosure.

FIG. 3 is a schematic plan view of a structure of multiple sub-pixels in a display region according to at least one embodiment of the present disclosure. As shown in FIG. 3, in a plane parallel to the display substrate, the multiple sub-pixels in the display region may be arranged in the following manner: repetitive units each including one first sub-pixel P1, two second sub-pixels P2, and one third sub-pixel P3 are arranged in each row, wherein the two second sub-pixels P2 in the repetitive unit is arranged in a column direction. Among them, the first sub-pixel P1 emits first-color light. The second sub-pixels P2 emit second-color light. The third sub-pixel P3 emits third-color light. A distance between sub-pixels emitting light of a same color in a row direction may approximately be one to twice, for example, 1.5 times, of a width of a sub-pixel. The two second sub-pixels P2 may be pentagons (for example, rounded pentagons). The two second sub-pixels P2 are symmetric with respect to each other, with a symmetry axis being parallel to the row direction. Each of the first sub-pixel P1 and the third sub-pixel P3 is a hexagon (for example, a rounded hexagon). A length of the first sub-pixel P1 in the column direction may be larger than a length of the third sub-pixel P3 in the column direction. The length of the third sub-pixel P3 in the column direction may be larger than a length of the second sub-pixel P2 in the column direction. In some examples, the first sub-pixel P1 may be a Red (R) sub-pixel, the second sub-pixels P2 may be Green (G) sub-pixels, and the third sub-pixel P3 may be a Blue (B) sub-pixel. Correspondingly, the first-color light may be red light, the second-color light may be green light, and the third-color light may be blue light. In this example, three sub-pixels of one pixel unit are arranged in a Delta shape. However, shapes and arrangement manner of the multiple sub-pixels in the display region are not limited in this embodiment. For example, a sub-pixel may in shape of a rectangle, a rhombus, a pentagon, or a hexagon. When one pixel unit includes three sub-pixels, the three sub-pixels may be arranged in parallel in a horizontal direction or in parallel in a vertical direction. When one pixel unit includes four sub-pixels, the four sub-pixels may be arranged in parallel in a horizontal direction, in parallel in a vertical direction, or in arranged a square.

Figure 4:
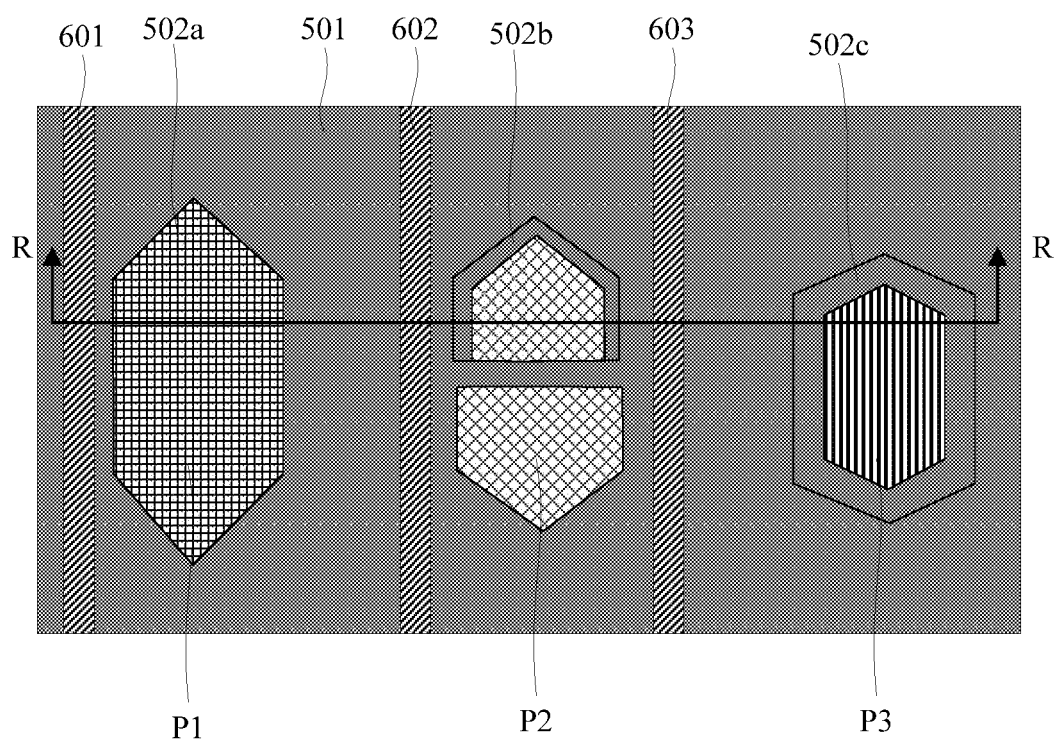
FIG. 4 is a schematic diagram of a partial structure of a display substrate according to at least one embodiment of the present disclosure.

FIG. 4 is a schematic diagram of a partial structure of a display substrate according to at least one embodiment of the present disclosure. FIG. 4 shows one repetitive unit of the display region as an example. A color filter layer is arranged at a light exiting side of a sub-pixel. As shown in FIG. 4, the color filter layer includes a black matrix 501, and a first color filter unit 502a, second color filter unit 502b and third color filter unit 502c which are periodically arranged. The matrix black 501 is located between adjacent color filter units. The first color filter unit 502a is located at a light exiting side of the first sub-pixel P1. An orthographic projection of the first color filter unit 502a on the underlaying substrate covers an opening region of the first sub-pixel P1. The second color filter unit 502b is located at a light exiting side of the second sub-pixel P2. An orthographic projection of the second color filter unit 502b on the underlaying substrate covers an opening region of the second sub-pixel P2. The third color filter unit 502c is located at a light exiting side of the third sub-pixel P3. An orthographic projection of the third color filter unit 502c on the underlaying substrate covers an opening region of the third sub-pixel P3. At least one sub-pixel includes an opening region and a non-opening region surrounding the opening region. The opening region of the sub-pixel is arranged for displaying and is not covered by the black matrix 501. The non-opening region surrounds the opening region, and is shielded by the black matrix 501 and not arranged for displaying. In some examples, the first color filter unit 502a is a red filter unit, the second color filter unit 502b is a green filter unit, and the third color filter unit 502c is a blue filter unit.

In some exemplary implementation modes, as shown in FIG. 4, a light regulation layer is arranged at a side of the black matrix 501 away from the underlaying substrate. An orthographic projection of the black matrix 501 on the underlaying substrate covers an orthographic projection of the light regulation layer on the underlaying substrate. The orthographic projection of the light regulation layer does not overlap with an orthographic projection of the color filter unit on the underlaying substrate. The orthographic projection of the light regulation layer on the underlaying substrate does not overlap with the opening regions of the multiple sub-pixels. In other words, the light regulation layer does not cover the opening regions of the sub-pixels. The light regulation layer includes multiple light regulation portions, such as a first light regulation portion 601, a second light regulation portion 602, and a third light regulation portion 603. The first light regulation portion 601 is located at a side of the first color filter unit 502a away from an adjacent second color filter unit 502b. The second light regulation portion 602 is located between the first color filter unit 502a and the adjacent second color filter unit 502b. The third light regulation portion 603 is located between the second color filter unit 502b and an adjacent third color filter unit 502c.

Among them, the first light regulation portion 601 is configured to adjust an emergent direction of first-color light emitted from the first color filter unit 502a. The second light regulation portion 602 and the third light regulation portion 603 are configured to adjust an emergent direction of second-color light emitted from the second color filter unit 502b. However, the number and arrangement positions of the light regulation portions of the light regulation layer are not limited in this embodiment. For example, light regulation portions may be arranged only on a periphery of the first color filter unit 502a (for example, at a side or two opposite sides of or around the first color filter unit 502a) so as to adjust the emergent direction of the first-color light emitted from the first color filter unit 502a. Alternatively, the light regulation portions may be arranged only on a periphery of the second color filter unit 502b (for example, at a side or two opposite sides of or around the second color filter unit 502b) so as to adjust the emergent direction of the second-color light emitted from the second color filter unit 502b. Alternatively, the light regulation portions may be arranged only on a periphery of the third color filter unit 502c (for example, at a side or two opposite sides of or around the third color filter unit 502c) so as to adjust the emergent direction of the third-color light emitted from the third color filter unit 502c. Alternatively, the light regulation portions may be arranged on peripheries of at least two color filter units so as to adjust emergent directions of light emitted from the corresponding color filter units.

In some exemplary implementation modes, at least part of light regulation portions of the light regulation layer may form an integrated structure. As shown in FIG. 4, second light regulation portions 602 of two adjacent second color filter units 502b at a side close to the first color filter units 502a may form an integrated structure. Third light regulation portions 603 of the two adjacent second color filter units 502b at a side close to third color filter units 502c may form an integrated structure. However, no limits are made thereto in this embodiment. In some examples, all the light regulation portions in the light regulation layer may be independent of one another. For example, light regulation portions corresponding to different color filter units are independent of one another and are not connected with one another.

In some exemplary implementation modes, as shown in FIG. 4, at least one light regulation portion of the light regulation layer may be in a strip-like structure. An extension direction of the light regulation portion may be perpendicular to a row direction of the sub-pixel and parallel to a column direction of the sub-pixel. The extension direction of the light regulation portion in the column direction of the sub-pixel may be larger than a length of an opening region of a corresponding sub-pixel in the column direction. For example, an extension direction of the first light regulation portion 601 in the column direction of the sub-pixel is larger than a length of an opening region of the first sub-pixel P1 in the column direction, and is also larger than a length of the first color filter unit 502a in the column direction of the sub-pixel. Respective extension directions of the second light regulation portion 602 and the third light regulation portion 603 in the column direction of the sub-pixel are each larger than a length of the opening region of the second sub-pixel P2 in the column direction, and are also larger a length of the second color filter unit 502b in the column direction of the sub-pixel. However, no limits are made thereto in this embodiment. For example, an extension direction of at least one light regulation portion in the column direction of the sub-pixel may be less than or equal to a length of an opening region of a corresponding sub-pixel in the column direction. Alternatively, an extension direction of the light regulation portion may be perpendicular to a column direction of the sub-pixel and parallel to a row direction of the sub-pixel.

Figure 5:
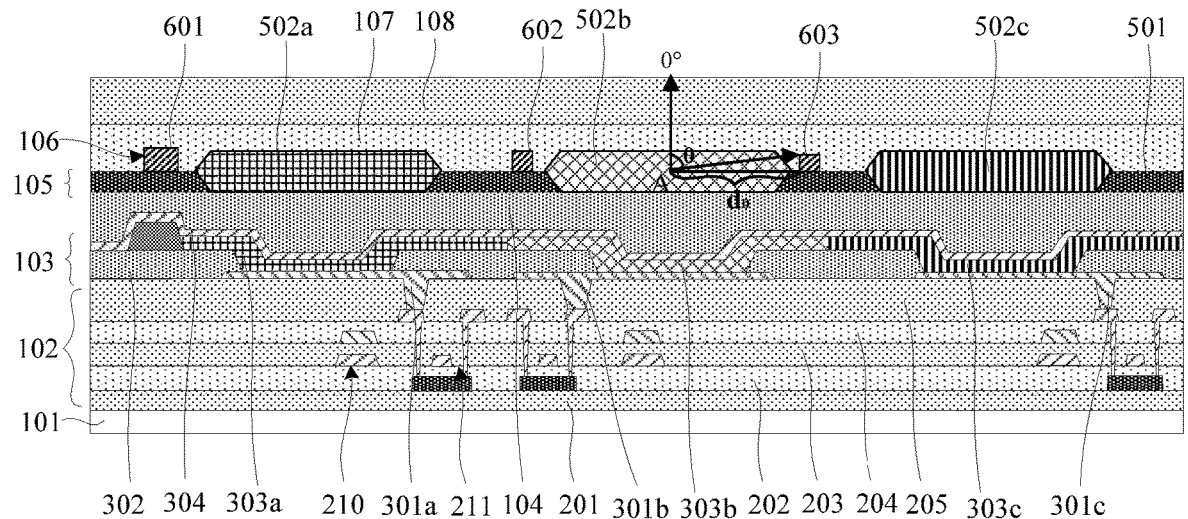
FIG. 5 is a schematic structural diagram of a display substrate according to at least one embodiment of the present disclosure.

FIG. 5 is a schematic structural diagram of a display substrate according to at least one embodiment of the present disclosure. FIG. 5 is a schematic diagram of a partial section along an R-R direction in FIG. 4. In some exemplary implementation modes, as shown in FIG. 5, in a plane perpendicular to the display substrate, the display substrate includes an underlaying substrate 101, a display structure layer arranged on the underlaying substrate 101, an encapsulation layer 104 located at a side of the display structure layer away from the underlaying substrate 101, a color filter layer 105 and a light regulation layer 106 which are located at a side of the encapsulation layer 104 away from the underlaying substrate 101, and a planarization (PLN) layer 107 and cover layer 108 which are located at a side of the light regulation layer 106 away from the underlaying substrate 101. In some possible implementation modes, the display substrate may include other film layers, such as spacer posts. However, no limits are made thereto in this embodiment.

In some exemplary implementation modes, the underlaying substrate 101 may be a flexible base substrate or a rigid base substrate. The display structure layer includes a driving structure layer 102 arranged on the underlaying substrate 101 and a light-emitting structure layer 103 located at a side of the driving structure layer 102 away from the underlaying substrate 101. The driving structure layer 102 includes multiple pixel driving circuits. At least one of the pixel driving circuits includes multiple transistors and at least one storage capacitor. For example, the pixel driving circuit may have a 3T1C, 4T1C, 5T1C, 5T2C, 6T1C, or 7T1C structure. As an example, each sub-pixel in FIG. 5 includes one transistor 211 and one storage capacitor 210.

In some examples, the driving structure layer 102 includes a semiconductor layer, a first gate metal layer, a second gate metal layer and a source/drain metal layer which are sequentially arranged on the underlaying substrate 101. A first insulating layer 201 is arranged between the semiconductor layer and the underlaying substrate 101. A second insulating layer 202 is arranged between the semiconductor layer and the first gate metal layer. A third insulating layer 203 is arranged between the first gate metal layer and the second gate metal layer. A fourth insulating layer 204 is arranged between the second gate metal layer and the source/drain metal layer. A fifth insulating layer 205 is arranged at a side of the source/drain metal layer away from the underlaying substrate 101. The semiconductor layer at least includes an active layer of the transistor 211. The first gate metal layer at least includes a gate electrode of the transistor 211 and a first capacitor electrode of the storage capacitor 210. The second gate metal layer at least includes a second capacitor electrode of the storage capacitor 210. The source/drain metal layer at least includes a source electrode and drain electrode of the transistor 211. In some examples, the first insulating layer 201 to the fourth insulating layer 204 may be inorganic insulating layers, and the fifth insulating layer 205 may be an organic insulating layer. However, no limits are made thereto in this embodiment.

In some examples, the light-emitting structure layer 103 includes multiple light-emitting elements. The light-emitting structure layer 103 may include a pixel definition layer (PDL) 302, a first electrode layer, a second electrode layer, and an organic light-emitting layer arranged between the first electrode layer and the second electrode layer. The first electrode layer is located at a side of the second electrode layer close to the underlaying substrate 101. The first electrode layer includes multiple first electrodes (such as first electrodes 301*a*, 301*b* and 301*c*). The second electrode layer includes a second electrode 304. For example, the first electrodes may be reflective electrodes, and the second electrode may be a transparent electrode or a transflective electrode. As shown in FIG. 5, a light-emitting element of the first sub-pixel includes a first electrode 301*a*, a second electrode 304, and an organic light-emitting layer 303*a* located between the first electrode 301*a* and the second electrode 304. A light-emitting element of the second sub-pixel may include a first electrode 301*b*, a second electrode 304, and an organic light-emitting layer 303*b* located between the first electrode 301*b* and the second electrode 304. A light-emitting element of the third sub-pixel may include a first electrode 301*c*, a second electrode 304, and an organic light-emitting layer 303*c* located between the first electrode 301*c* and the second electrode 304. The light-emitting element of the first sub-pixel is described as an example. The first electrode 301*a* of the light-emitting element of the first sub-pixel is connected with a drain electrode of a transistor 211 of the corresponding pixel driving circuit through a via. The pixel definition layer 302 is provided with multiple pixel definition layer openings. Each pixel definition layer opening at least partially exposes the corresponding first electrode 301*a*. The organic light-emitting layer 303*a* is arranged at a side of the first electrode 301*a* away from the underlaying substrate 101, and is in contact with the first electrode 301*a* through a pixel definition layer opening. The second electrode 304 is arranged at a side of the organic light-emitting layer 303*a* away from the underlaying substrate 101, and is in contacts with the organic light-emitting layer 303*a*. The organic light-emitting layer 303*a* in a pixel definition layer opening is driven by the first electrode 301*a* and the second electrode 304 to emit first-color light. Similarly, the organic light-emitting layer 303*b* in a pixel definition layer opening is driven by the first electrode 301*b* and the second electrode 304 to emit second-color light. The organic light-emitting layer 303*c* in a pixel definition layer opening is driven by the first electrode 301*c* and the second electrode 304 to emit third-color light. An orthographic projection of the pixel definition layer opening on the underlaying substrate 101 includes an orthographic projection of the opening region of the sub-pixel on the underlaying substrate 101.

In some exemplary implementation modes, the organic light-emitting layer may include a Hole Injection Layer (HIL), a Hole Transport Layer (HTL), an Electron Block Layer (EBL), Emitting Layer (EML), a Hole Block Layer (HBL), an Electron Transport Layer (ETL), and an Electron Injection Layer (EIL) which are stacked. In some examples, the hole injection layers and the electron injection layers of all the sub-pixels may be connected together as an intercommunicated layer. The hole transport layers and the electron transport layers of all the sub-pixels may be connected together as an intercommunicated layer. The hole block layers of all the sub-pixels may be connected together as an intercommunicated layer. The emitting layers and the electron block layers of adjacent sub-pixels may overlap with each other in a small portion, or may be isolated from each other. The hole block layers may be connected together as an intercommunicated layer. However, no limits are made thereto in this embodiment.

In some exemplary implementation modes, the encapsulation layer 104 may include a first encapsulation layer, second encapsulation layer and third encapsulation layer which are stacked. The first encapsulation layer and the third encapsulation layer may be made of an inorganic material. The second encapsulation layer may be made of an organic material. The second encapsulation layer is arranged between the first encapsulation layer and the third encapsulation layer so as to ensure that external moisture cannot enter the light-emitting element. However, no limits are made thereto in this embodiment.

In some exemplary implementation modes, as shown in FIG. 5, in a plane perpendicular to the display substrate, sections of the first light regulation portion 601, the second light regulation portion 602 and the third light regulation portion 603 of the light regulation layer 106 may all be rectangles. For example, the sections of the first light regulation portion 601, the second light regulation portion 602 and the third light regulation portion 603 are rectangles of different sizes. However, no limits are made thereto in this embodiment. For example, section sizes of different light regulation portions may be the same. Alternatively, section shapes of different light regulation portions may be different.

Figure 6:
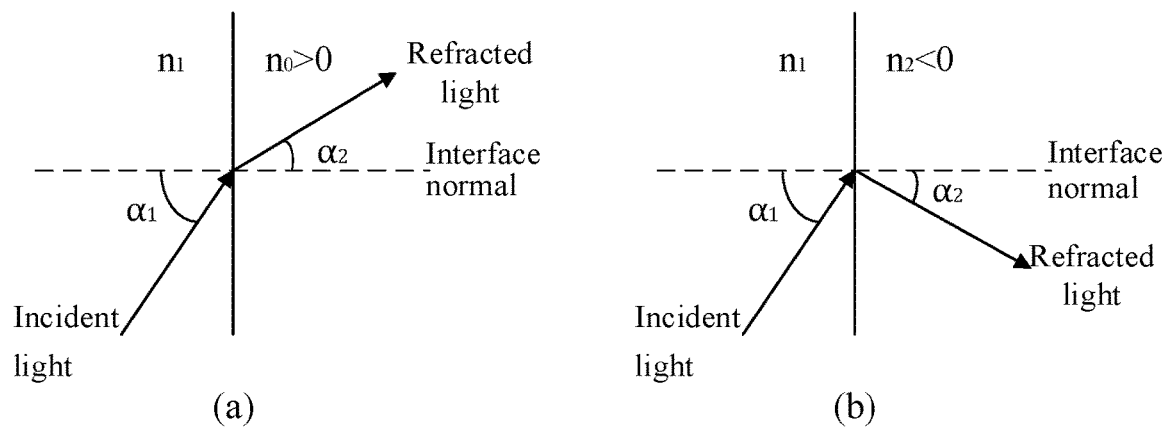
FIG. 6 is a schematic diagram of characteristics of a photo-refractive material.

In some exemplary implementation modes, the light regulation layer 106 may be made of a negative-refractive-index material, i.e., a material with a refractive index smaller than 0. For example, the material of the light regulation layer 106 may include at least one of a photonic crystal material and a dual-dielectric negative-refractive-index material (such as modified polyimide). FIG. 6 is a schematic diagram of characteristics of a photo-refractive material. FIG. 6(a) is a schematic diagram of a light refraction condition of an ordinary material. FIG. 6(b) is a schematic diagram of a light refraction condition of a negative-refractive-index material. In FIG. 6, $n_0$ represents a refractive index of the ordinary material, $n_2$ represents a refractive index of the negative-refractive-index material, and $n_1$ represents a refractive index of air. As shown in FIG. 6(b), the negative-refractive-index material has a characteristic that incident light and refracted light are located on a same side of an interface normal. After light passes through the negative-refractive-index material, a path of the light may be changed, and the light is emitted from the same side as an incidence direction relative to the interface normal. In this exemplary implementation mode, the light regulation layer is designed by use of the characteristic of the negative-refractive-index material, so that a path of light emitted from the color filter layer may be changed to improve the view angle color shift of the display substrate.

Figure 7A:
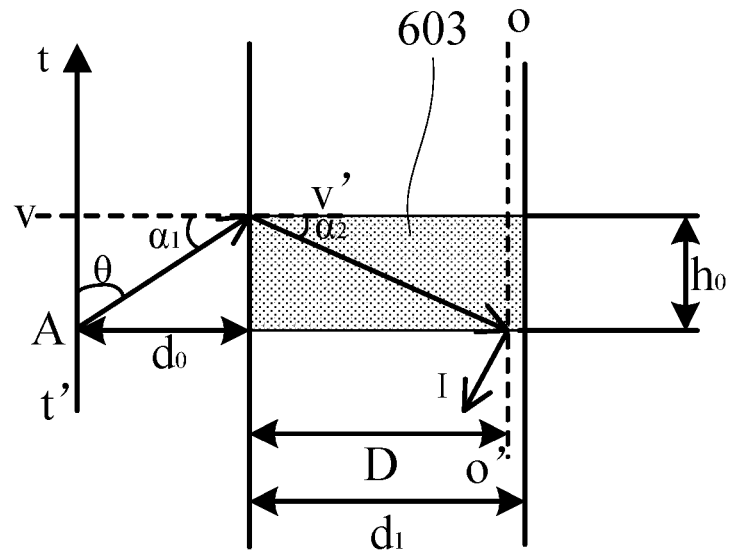
FIGS. 7A and 7B are schematic diagrams of a relationship between a first length and second length of a light regulation portion according to at least one embodiment of the present disclosure.
Figure 7B:
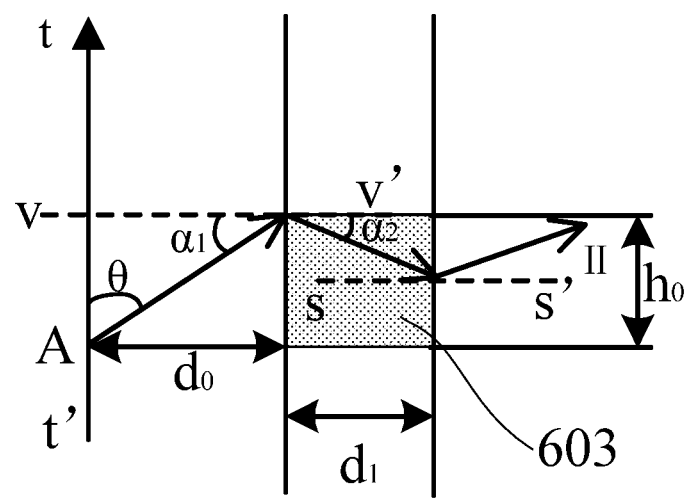

FIGS. 7A and 7B are schematic diagrams of a relationship between a first length and a second length of a light regulation portion according to at least one embodiment of the present disclosure. FIGS. 7A and 7B are partial schematic diagrams of a plane crossing a centerline of a sub-pixel corresponding to the light regulation portion and perpendicular to the underlaying substrate. As shown in FIG. 7A, incident light of the light regulation portion may be propagated along a first path I when the first length and the second length of the light regulation portion satisfy a certain condition. The first length is a size of the light regulation portion in a first direction. The second length is a size of the light regulation portion in a second direction. The first direction is perpendicular to a plane where the display substrate is located. The first length may be referred to as a thickness or a height of the light regulation portion. The second direction is parallel to the plane where the display substrate is located, and may be intersected with the centerline of the sub-pixel corresponding to the light regulation portion. The second length may be referred to as a width of the light regulation portion.

Here, θ represents a squint angle. θ may not be 0°. tt' represents a centerline of a sub-pixel. Light at a view angle of 0° may be emitted along tt'. A represents an intersection point between the centerline tt' of the sub-pixel and an extension plane of a bottom surface (i.e., a surface of the light regulation portion 603 close to the underlaying substrate) of the light regulation portion 603. $\alpha_1$ represents an incidence angle of light from a first medium to an interface of the light regulation portion 603. $\alpha_2$ represents a refraction angle of the light at the interface of the light regulation portion 603. $n_2$ represents a refractive index of the light regulation portion 603. $n_1$ represents a refractive index of the first medium (such as an air layer or a conventional filing layer). $d_0$ represents a vertical distance from the light regulation portion 603 to the centerline of the sub-pixel. $h_0$ represents a thickness of the light regulation portion 603. $d_1$ represents a width of the light regulation portion 603. D represents a critical width of the light regulation portion 603. vv' represents an interface normal of incidence of light from the first medium to the light regulation portion 603. ss' represents an interface normal of incidence of light from the light regulation portion 603 to the first medium. oo' represents an interface normal of incidence of light from the light regulation portion 603 to the black matrix 501.

In some exemplary implementation modes, the third light regulation portion 603 with a rectangular section in FIG. 5 is described as an example. The following relationships may be obtained according to FIG. 7A.

$$\frac{\sin \alpha_1}{\sin \alpha_2} = \frac{n_2}{n_1} \qquad \text{(Formula 1)}$$

$$\tan \theta = \frac{d_0}{h_0} \qquad \text{(Formula 2)}$$

$$\tan \alpha_2 = \frac{h_0}{D} \qquad \text{(Formula 3)}$$

$$\alpha_1 = \frac{\pi}{2} - \theta \qquad \text{(Formula 4)}$$

The following formula may be obtained according to formula 2.

$$h_0 = \frac{d_0}{\tan \theta} \qquad \text{(Formula 5)}$$

The following formula may be obtained according to formulas 1, 2, 3 and 4.

$$D = \frac{d_0}{\tan \theta \tan \left\{ \arcsin \left[ \frac{n_1}{n_2} \sin \left( \frac{\pi}{2} - \theta \right) \right] \right\}} \qquad \text{(Formula 6)}$$

It can be seen according to formula 5 that the thickness $h_0$ of the light regulation portion 603 is correlated with the squint angle θ and the vertical distance $d_0$ from the light regulation portion 603 to the centerline of the corresponding sub-pixel.

It can be seen according to formula 6 that the critical width D of the light regulation portion 603 is correlated with the squint angle θ, the vertical distance do from the light regulation portion 603 to the centerline of the corresponding sub-pixel, the refractive index $n_2$ of the light regulation portion 603, and the refractive index $n_1$ of the first medium.

When the width $d_1$ of the light regulation portion 603 is larger than or equal to the critical width D, emergent light is propagated along the first path I, as shown in FIG. 7A. That is, when the thickness $h_0$ of the light regulation portion 603 is equal to $d_0/\tan\theta$ and the width $d_1$ of the light regulation portion 603 is larger than or equal to D, light at a view angle θ ranging from 0° to 90° enters the interface of the light regulation portion 603 along a propagation path, and then is refracted into the black matrix 501 along the first path I. Light beams entering the black matrix 501 are mostly absorbed by the black matrix 501. Therefore, the light path may be changed by the light regulation portion 603 to adjust a light color corresponding to an excessively high brightness proportion in RGB for compositing white light to further improve the view angle color shift of the display substrate.

When the width $d_1$ of the light regulation portion 603 is smaller than the critical width D, emergent light is propagated along a second path II, as shown in FIG. 7B. Since the width $d_1$ of the light regulation portion 603 is smaller than the critical width D, light does not reach the interface of the light regulation portion 603 and the black matrix 501 for secondary refraction, and is propagated along the second path II, i.e., an initial propagation direction. In such case, the light regulation portion 603 cannot change the light path.

As shown in FIGS. 7A and 7B, the width $d_1$ of the light regulation portion of the light regulation layer needs to be designed to be larger than or equal to the critical width D.

In this exemplary implementation mode, the light regulation layer is configured to adjust an emergent direction of light of at least one color (such as first-color light and second-color light) emitted from the color filter layer. Therefore, a light intensity of the light of the at least one color entering human eyes in a squint angle direction may be controlled to further improve the view angle color shift of the display substrate.

Figure 8:
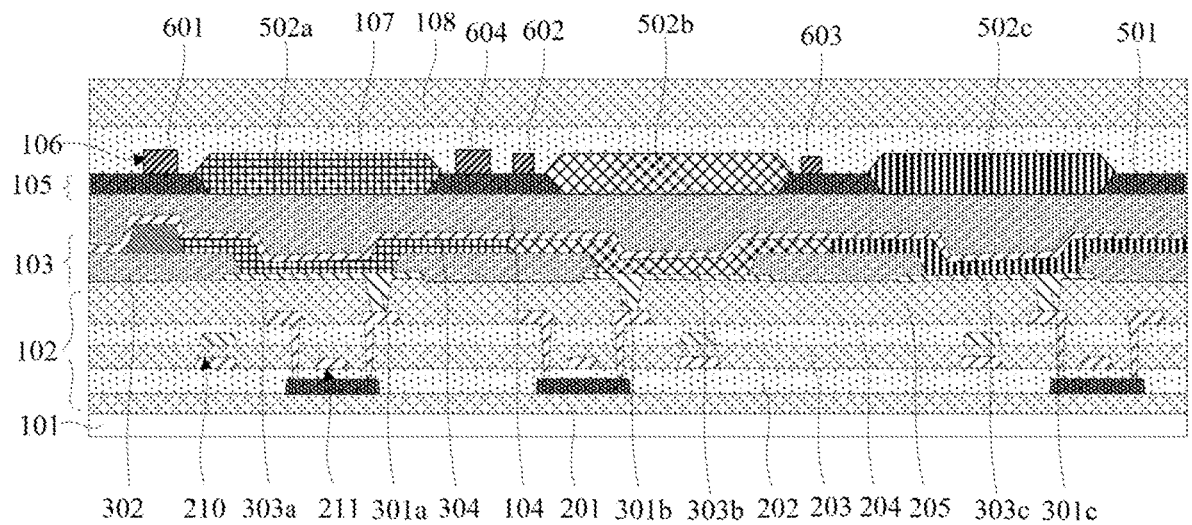
FIG. 8 is another schematic structural diagram of a display substrate according to at least one embodiment of the present disclosure.

FIG. 8 is a schematic diagram of another structure of a display substrate according to at least one embodiment of the present disclosure. In some exemplary implementation modes, as shown in FIG. 8, in a plane perpendicular to the underlaying substrate, the display substrate includes an underlaying substrate 101, a display structure layer arranged on the underlaying substrate 101, an encapsulation layer 104 located at a side of the display structure layer away from the underlaying substrate 101, a color filter layer 105 and a light regulation layer 106 which are located at a side of the encapsulation layer 104 away from the underlaying substrate 101, and a planarization layer 107 and a cover layer 108 which are located at a side of the light regulation layer 106 away from the underlaying substrate 101. In some examples, the display structure layer includes a driving structure layer 102 arranged on the underlaying substrate 101 and a light-emitting structure layer 103 located at a side of the driving structure layer 102 away from the underlaying substrate 101. The driving structure layer 102 includes a semiconductor layer, a first gate metal layer, a second gate metal layer, and a source/drain metal layer which are arranged on the underlaying substrate 101.

In this example, wirings of the source/drain metal layer are arranged below the light-emitting element, and vias are formed in a fifth insulating layer 205 to implement connection of the first electrodes with corresponding pixel driving circuits. As a result, the first electrodes may be not flat and may be inclined. That is, an inclination angle is formed between planes where the first electrode and the underlaying substrate 101 are located. In some examples, an inclination angle of the first electrode (i.e., an included angle between the plane where the first electrode is located and the plane where the underlaying substrate is located) is, for example, 4 degrees. As shown in FIG. 8, under the influence of the source/drain metal layer below a first electrode 301a of a first sub-pixel, a right side of the first electrode 301a is raised, and thus the first electrode 301a is inclined. A left side of a first electrode 301b of a second sub-pixel is raised, and thus the first electrode 301b is inclined. A right side of a first electrode 301c of a third sub-pixel is raised, and thus the first electrode 301c is inclined. Since first electrodes of sub-pixels of different colors are inclined in different directions, degrees of brightness decays (L-decays) of the light-emitting element in different directions are different, and single-color proportions of three colors RGB for compositing white light at different view angles change relatively greatly, resulting in a serious color shift. Moreover, since decay degrees of different color filter units in different wave bands are different, degrees of brightness decays (L-decays) of light of different colors at different view angles may be different, resulting in a serious color shift.

In this exemplary implementation mode, the light regulation layer is arranged on the black matrix, and different parameters (such as thicknesses and widths) are designed for the light regulation portions adjusting emergent directions of light of different colors. Therefore, brightness ratios of RGB for compositing white light at different view angles may be controlled to a best brightness ratio to effectively improve the view angle color shift.

In some exemplary implementation modes, it can be seen according to an optical distance formula $2d_1 n = k\lambda$ (where k is an integer, $d_1$ represents an optical distance, i.e., a width of the light regulation portion here, 2 represents a wavelength, and n represents a refractive index of the light regulation portion) that, since refractive indexes for propagation of light of different colors in the same medium are different and different light colors for compositing white light need to be adjusted according to different proportions, thicknesses and widths $d_1$ of light regulation portions adjusting emergent directions of light of different colors may be different.

In some exemplary implementation modes, as shown in FIG. 8, the light regulation layer 106 includes a first light regulation portion 601 and a fourth light regulation portion 604 located at two opposite sides of the first color filter unit 502a, and a second light regulation portion 602 and a third light regulation portion 603 located at two opposite sides of the second color filter unit 502b. The second light regulation portion 602 and the fourth light regulation portion 604 are located between the first color filter unit 502a and the second color filter unit 502b. The second light regulation portion 602 is close to the second color filter unit 502b. The fourth light regulation portion 604 is close to the first color filter unit 502a. The third light regulation portion 603 is located between the second color filter unit 502b and the third color filter unit 502c. In this exemplary implementation mode, the first color filter unit 502a is a red filter unit, the second color filter unit 502b is a green filter unit, and the third color filter unit 502c is a blue filter unit. In this exemplary implementation mode, emergent directions of red light and green light may be adjusted at the same time by the light regulation layer 106 so as to control light intensities of the red light and the green light entering human eyes at a squint angle.

Figure 9:
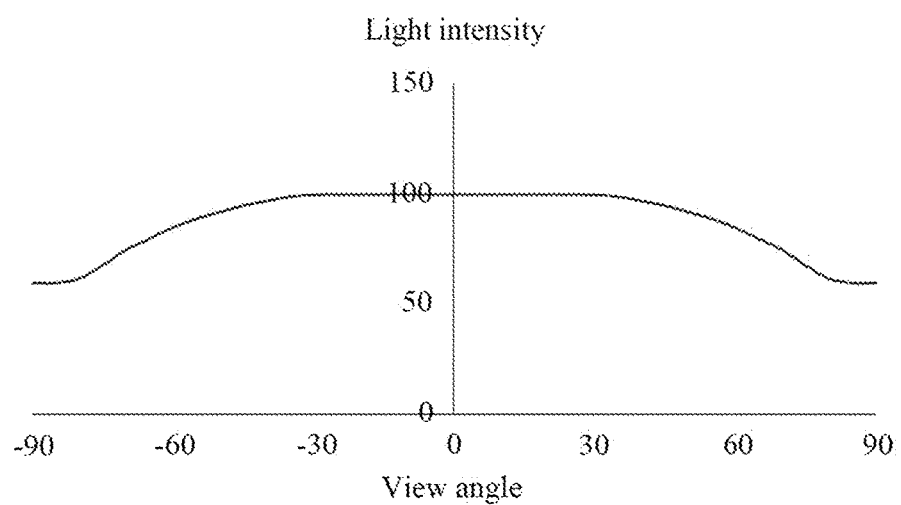
FIG. 9 is a schematic diagram of light intensity control by a light regulation layer at different view angles according to at least one embodiment of the present disclosure.
Figure 10:
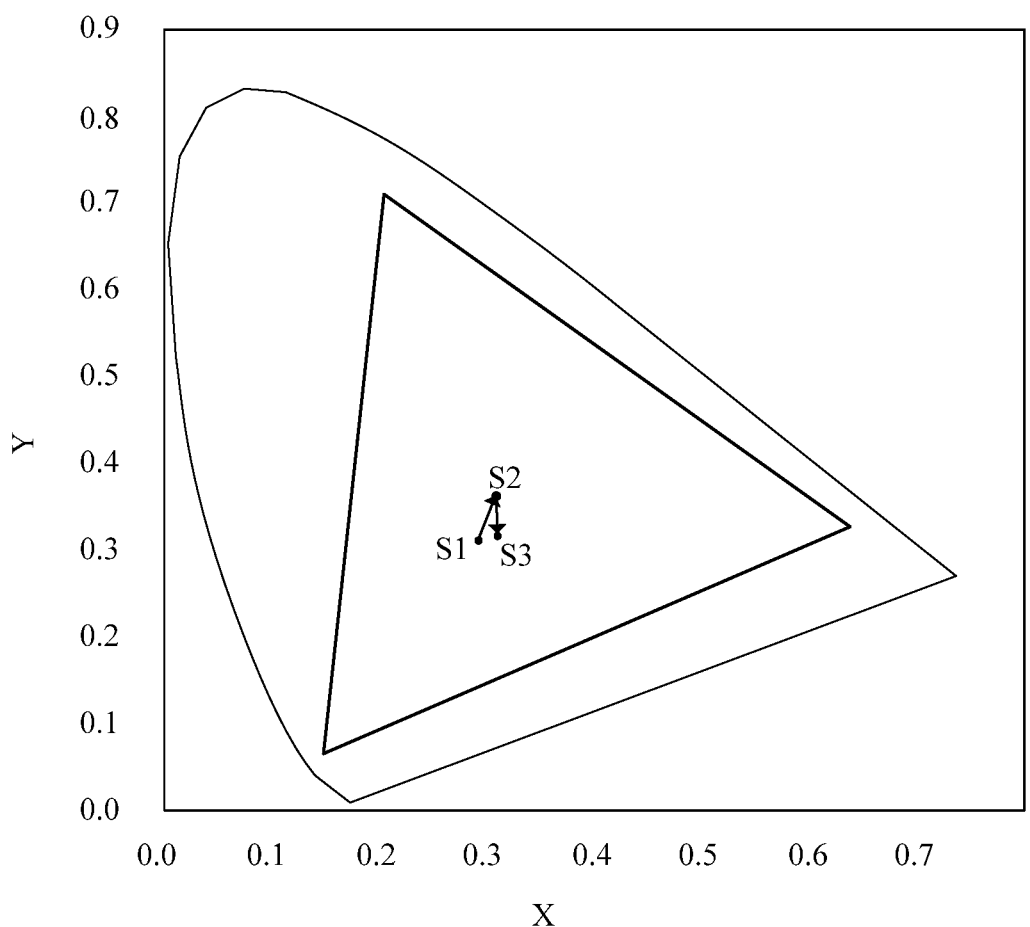
FIG. 10 is a schematic diagram of improvement effect on color shift of a display substrate at a squint angle according to at least one embodiment of the present disclosure.

Light intensities of three primaries RGB entering human eyes at the squint angle may be controlled based on differences of refractive indexes for light of different colors in the same medium and in combination with the above-mentioned formulas 1 to 6 and a best brightness ratio of about 3:6:1 of RGB for compositing white light. FIG. 9 is a schematic diagram of light intensity control of a light regulation layer at different view angles according to at least one embodiment of the present disclosure. As shown in FIG. 9, by the adjustment of the light regulation layer 106, a light intensity at a relatively small view angle is relatively high, and when the view angle is larger than 30°, the light intensity gradually decreases with the increase of the view angle. Light intensity control ratios at different view angles may be obtained by adjusting emergent directions of light of different colors by use of the light regulation layer 106 so as to get the display substrate from a yellow shift back to a white balance at the squint angle. FIG. 10 is a schematic diagram of an improvement effect on color shift of a display substrate at a squint angle according to at least one embodiment of the present disclosure. As shown in FIG. 10, composition of white light at a front view angle corresponds to point S1, composition of white light at a squint angle by a display substrate without a light regulation layer corresponds to point S2, and composition of white light at a squint angle by the display substrate provided in this embodiment corresponds to point S3. It can be seen that, by use of the light regulation layer of the display substrate of this embodiment, a brightness ratio of RGB at the squint angle can reach a ratio at the front view angle for the composition of white light so as to improve the condition of yellow shift at the squint angle.

In some exemplary implementation modes, differentiated designs of the light regulation portions of the light regulation layer of the display substrate for improving the above-mentioned condition is described based on the display substrate shown in FIG. 8 taking the condition that the display substrate has a yellow shift at a view angle of 70°, a brightness ratio of RGB at a left-side view angle is 3.3:6.1:0.6 and a brightness ratio of RGB at a right-side view angle is 3.2:6.1:0.7 as an example. It is assumed that the squint angle is 0, a sub-pixel size is $a_1$ microns (um), a distance between adjacent sub-pixels is b1 um, a refractive index of the light regulation layer for a light beam is $n_2$, and a distance from the light regulation portion to the sub-pixel (such as a vertical distance from an edge of the light regulation portion close to the sub-pixel to an edge of the opening region of the sub-pixel close to the adjacent light regulation portion) is d um. In such case, a vertical distance do from a centerline of a first sub-pixel (such as a red sub-pixel) to a light regulation portion (such as the first light regulation portion 601 or the fourth light regulation portion 604) is (a1/2+d) um. It can be seen according to the above-mentioned formulas 1 to 6 that a height $h_0$ and critical width D of the light regulation portion satisfy the following relational expressions:

$$h_0 = \frac{\left(\frac{a_1}{2} + d\right)}{\tan \theta} \quad \text{(Formula 7)}$$

$$D = \frac{\left(\frac{a_1}{2} + d\right)}{\tan \theta \tan\left\{\arc \sin\left[\frac{n_1}{n_2}\sin\left(\frac{\pi}{2} - \theta\right)\right]\right\}} \quad \text{(Formula 8)}$$

In some examples, a size of the first sub-pixel (such as a red sub-pixel) is about 10 um, a distance between adjacent sub-pixels is 15 um, a refractive index $n_{2R}$ of the light regulation layer for red light is-0.7, a first medium is an air layer, $n_1$ represents a refractive index of the air layer, and a distance from the light regulation portion to the first sub-pixel is about 2 um. A size of the second sub-pixel (such as a green sub-pixel) is about 5 um, a distance between adjacent sub-pixels is 8 um, a refractive index of the light regulation layer for green light is $n_{2G}$, and a distance from the light regulation portion to the second sub-pixel is about 1 um. Related data corresponding to the first sub-pixel may be substituted into formula 7 and formula 8 to obtain the following equations:

$$h_{0R} = \frac{7}{\tan 70°} = 2.55 \text{ um.}$$

$$D = \frac{7}{\tan 70° \tan 29.3°} = 4.54 \text{ um.}$$

Taking the condition that light regulation portions at peripheries of the first sub-pixel and the second sub-pixel have the same widths as an example, the following equation may be obtained according to $2d_1 n = k\lambda$.

$$\frac{n_{2R}}{n_{2G}} = \frac{\lambda_R}{\lambda_G}.$$

Accordingly, $n_{2G} = -0.6$ may be obtained.

Related data corresponding to the second sub-pixel may be substituted into formula 7 and formula 8 to obtain the following equations:

$$h_{0G} = \frac{3.5}{\tan 70°} = 1.27 \text{ um.}$$

$$D = \frac{3.5}{\tan 70° \tan 35°} = 1.82 \text{ um.}$$

The brightness ratio of 3.3:6.1:0.6 of RGB at the left side needs to be adjusted to the best brightness ratio 3:6:1. In such case, brightness of red light needs to be reduced by 45%, and brightness of green light needs to be reduced by 41%. That is, adjustment factors $f_R$ and $f_G$ are 45% and 41% respectively. Based on this, a thickness $h_{0R}$ of the first light regulation portion 601 arranged at the left side of the first sub-pixel needs to be multiplied by the adjustment factor $f_R$ of 45% to obtain $h_{0R}=f_R \times 2.55=1.15$ um. A thickness hoc of the first light regulation portion 602 arranged at the left side of the second sub-pixel needs to be multiplied by the adjustment factor $f_G$ of 41% to obtain $h_{0G}=f_G \times 1.27=0.52$ um.

The brightness ratio of 3.2:6.1:0.7 of RGB at the right side needs to be adjusted to the best brightness ratio 3:6:1. In such case, brightness of red light needs to be reduced by 34%, and brightness of green light needs to be reduced by 31%. That is, adjustment factors $f_R$ and $f_G$ are 34% and 31% respectively. Based on this, a thickness $h_{0R}$ of the fourth light regulation portion 604 arranged at the right side of the first sub-pixel needs to be multiplied by the adjustment factor $f_R$ of 34% to obtain $h_{0R}=f_R \times 2.55=0.87$ um. A thickness hoc of the third light regulation portion 603 arranged at the right side of the second sub-pixel needs to be multiplied by the adjustment factor $f_G$ of 31% to obtain $h_{0G}=f_G \times 1.27=0.39$ um.

In this example, the adjustment factors of the red light and the green light may be determined based on an actual brightness ratio of RGB to be adjusted and the best brightness ratio taken as an adjustment target and in combination with a brightness adjustment algorithm. Implementations of the brightness adjustment algorithm are not limited in this embodiment.

It can be seen from the above that, as shown in FIG. 8, the first light regulation portion 601 is arranged 2 um away from the first sub-pixel at the left side of the first sub-pixel, and the fourth light regulation portion 604 is arranged 2 um away from the first sub-pixel at the right side of the first sub-pixel. Among them, a thickness of the first light regulation portion 601 is about 1.15 µm, and a width of the first light regulation portion 601 is about 5 um. A thickness of the fourth light regulation portion 604 is about 0.87 um, and a width of the fourth light regulation portion 604 is about 5 µm. The first light regulation portion 601 may control reducing the brightness of the red light by 45% in a view angle range from 70° to 90°. The fourth light regulation portion 604 may control reducing the brightness of the red light by 34% in a view angle range from 70° to 90°. The second light regulation portion 602 is arranged 1 um away from the second sub-pixel at the left side of the second sub-pixel. The third light regulation portion 603 is arranged 1 um away from the second sub-pixel at the right side of the second sub-pixel. Among them, a thickness of the second light regulation portion 602 is about 0.52 um, and a width of the second light regulation portion 602 is about 5 um. A thickness of the third light regulation portion 603 is about 0.39 um, and a width of the third light regulation portion 603 is about 5 µm. The second light regulation portion 602 may control reducing the brightness of the green light by 41% in a view angle range from 70° to 90°. The third light regulation portion 603 may control reducing the brightness of the green light by 31% in a view angle range from 70° to 90°. In this exemplary implementation mode, the brightness ratios of RGB at the left and right sides at the view angle of 70° may be adjusted to 3:6:1, thereby improving the yellow shift of the display substrate at the view angle of 70°. In this example, the widths of the first light regulation portion 601 to the fourth light regulation portion 604 may all be 5 um, so as to simplify processes. However, no limits are made thereto in this embodiment. For example, the widths of the first light regulation portion 601 and the fourth light regulation portion 604 are larger than or equal to 4.54 um, and the widths of the second light regulation portion 602 and the third light regulation portion 603 are larger than or equal to 1.82 um. In this example, the yellow shift at a view angle of 60° can be eliminated, and the yellow shifts at the view angle of 70° and a view angle of 80° can be alleviated significantly.

In some exemplary implementation modes, a maximum thickness and a minimum width of the light regulation portion corresponding to the first sub-pixel and a maximum thickness and a minimum width of the light regulation portion corresponding to the second sub-pixel may be determined according to the condition that a distance from a light regulation portion to a corresponding sub-pixel is an initial value (such as 2 um) and in combination with formula 7 and formula 8. Then, the thickness of the first light regulation portion 601 at the left side of the first sub-pixel and the thickness of the second light regulation portion 602 at the left side of the second sub-pixel may be determined according to the adjustment factors for the brightness of the red light and the green light at the left side, the maximum thickness of the light regulation portion corresponding to the first sub-pixel, and the maximum thickness of the light regulation portion corresponding to the second sub-pixel. The width of the first light regulation portion 601 at the left side of the first sub-pixel and the width of the second light regulation portion 602 at the left side of the second sub-pixel may be determined according to the minimum width of the light regulation portion corresponding to the first sub-pixel and the minimum width of the light regulation portion corresponding to the second sub-pixel. After the widths and thicknesses of the first light regulation portion 601 and the second light regulation portion 602 are determined, the width and the thickness of the fourth light regulation portion 604 at the right side of the first sub-pixel may be designed to be the same as those of the first light regulation portion 601 respectively, and the width and the thickness of the third light regulation portion 603 at the right side of the second sub-pixel may be designed to be the same as those of the second light regulation portion 602 respectively. In this example, the distance from the fourth light regulation portion 604 to the first sub-pixel is adjusted to adjust the brightness decay degree of the red light at the right side. The distance from the third light regulation portion 603 to the second sub-pixel is adjusted to adjust the brightness decay degree of the green light at the right side. As such, the brightness ratio of RGB at the right side is adjusted to the best brightness ratio. However, no limits are made thereto in this embodiment.

In some exemplary implementation modes, sizes of the first light regulation portion 601, the second light regulation portion 602, the third light regulation portion 603 and the fourth light regulation portion 604 may be the same. Sectional shapes of the four light regulation portions may be the same, and may have a same width and a same thickness. In this example, the distance from the first light regulation portion 601 to the first sub-pixel may be adjusted to adjust the decay degree of the red light at the left side. The distance from the fourth light regulation portion 604 to the first sub-pixel may be adjusted to adjust the decay degree of the red light at the right side. The distance from the second light regulation portion 602 to the second sub-pixel may be adjusted to adjust the decay degree of the green light at the left side. The distance from the third light regulation portion 603 to the second sub-pixel may be adjusted to adjust the decay degree of the green light at the right side. As such, both the brightness ratio of RGB at the right side and the brightness ratio of RGB at the left side are adjusted to the best brightness ratio. However, no limits are made thereto in this embodiment.

Figure 11:
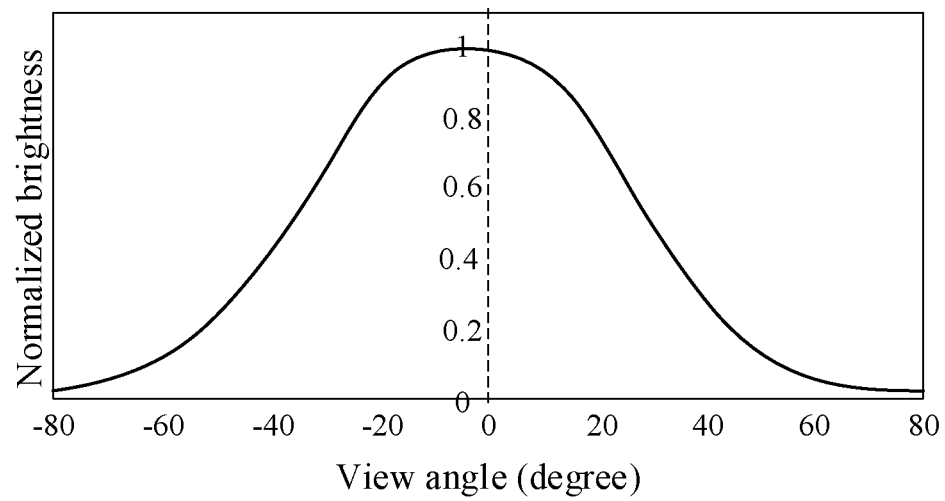
FIG. 11 is a schematic diagram of a brightness decay of a display substrate according to at least one embodiment of the present disclosure.
Figure 11:
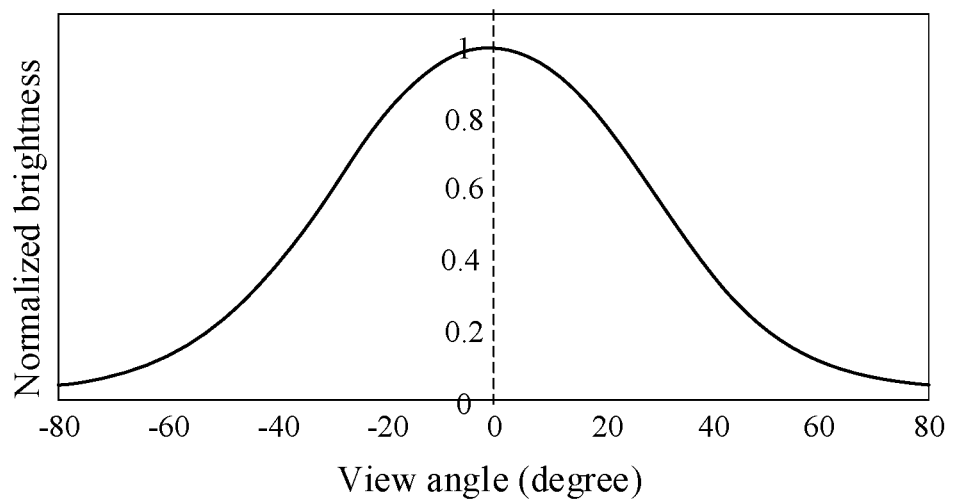

FIG. 11 is a schematic diagram of a brightness decay of a display substrate according to at least one embodiment of the present disclosure. FIG. 11(*a*) is a schematic diagram of a brightness decay of a display substrate which have an inclined first electrode and is not provided with a light regulation layer. FIG. 11(*b*) is a schematic diagram of a brightness decay of the display substrate shown in FIG. 8. As shown in FIG. 11(*a*), a maximum brightness point of the display substrate is at a position in a negative direction 4°. The brightness decay is asymmetric, and the brightness decays relatively fast in a positive direction. There is a deviation between brightness decays in the two directions. A deviation between positive 30° and negative 30° is about 12%. A deviation between positive and negative 45° is about 10%. As shown in FIG. 11(*b*), the display substrate of this exemplary implementation mode is provided with the light regulation layer, so that a deviation between brightness decays in positive and negative view angle directions may be improved.

According to the display substrate provided in this exemplary implementation mode, differentiated designs are performed on the light regulation portions at two sides of the first color filter unit and the second color filter unit, so that decay degrees of light intensities changing with the view angle at two sides of RGB sub-pixels may be controlled to further improve the view angle color shift.

Other structures of the display substrate of this exemplary embodiment may refer to the descriptions in the above-mentioned embodiments, and thus will not be repeated herein. The structure (or method) shown in this implementation mode may be combined with structures (or methods) shown in other implementation modes as appropriate.

Figure 12:
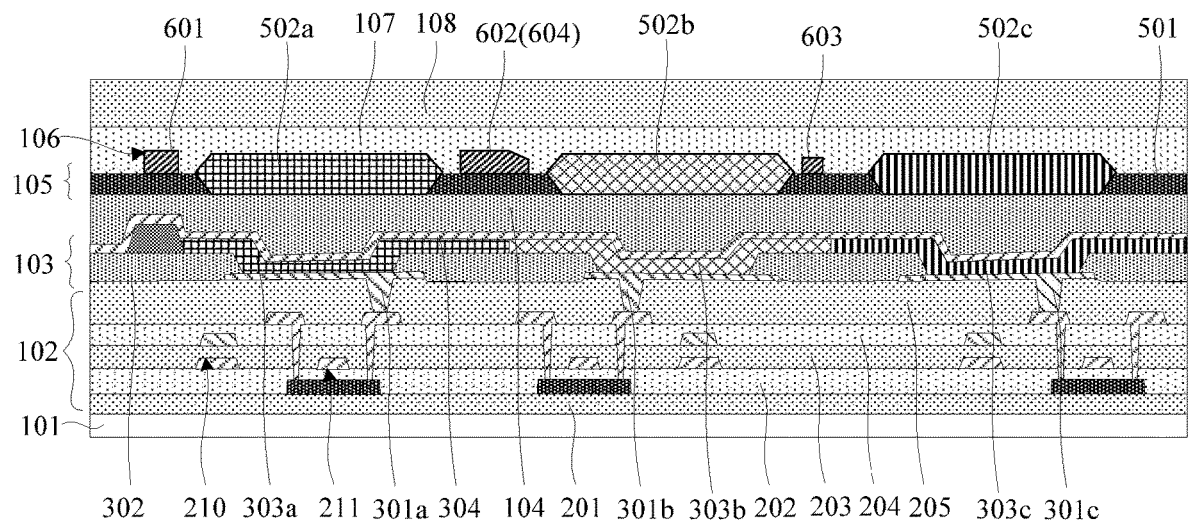
FIG. 12 is another structural schematic diagram of a display substrate according to at least one embodiment of the present disclosure.

FIG. 12 is a schematic diagram of another structure of a display substrate according to at least one embodiment of the present disclosure. In some exemplary implementation modes, as shown in FIG. 12, the second light regulation portion 602 and fourth light regulation portion 604 between the first color filter unit 502a and the second color filter unit 502b may form an integrated structure. A thickness of the integrated structure formed by the fourth light regulation portion 604 and the second light regulation portion 602 at a side close to the first color filter unit 502a is larger than a thickness at a side close to the second color filter unit 502b. For example, a top surface of the second light regulation portion 602 is connected with a lateral surface of the second color filter unit 502b through an inclined plane. Based on the example in the embodiment shown in FIG. 8, a thickness at the side of the second light regulation portion 602 close to the first color filter unit 502a is about 0.87 um, and a thickness at the side of the second light regulation portion 602 close to the second color filter unit 502b is about 0.52 um. However, no limits are made thereto in this embodiment.

According to the display substrate provided in this exemplary implementation mode, the light regulation layer is configured to change a light path to control light intensities of light of different colors entering human eyes at the squint angle and reconfigure a brightness ratio of RGB so as to improve the view angle color shift of the display substrate.

Other structures of the display substrate of this embodiment may refer to the descriptions in the above-mentioned embodiments, and thus will not be repeated herein. The structure (or method) shown in this implementation mode may be combined with structures (or methods) shown in other implementation modes as appropriate.

Figure 13:
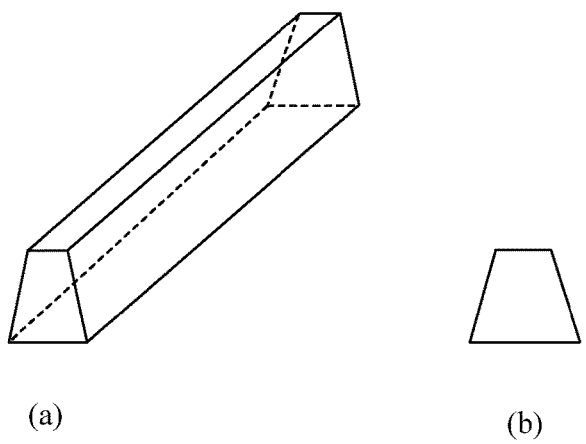
FIGS. 13 to 15 are three-dimensional and sectional schematic structural diagrams of a light regulation portion according to at least one embodiment of the present disclosure.
Figure 14:
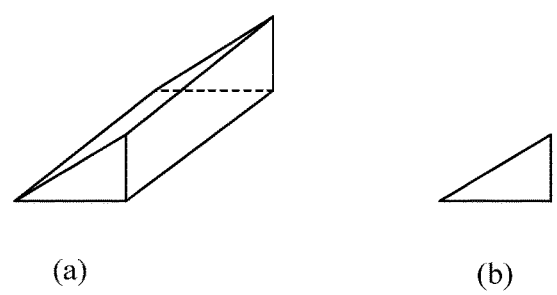
Figure 15:
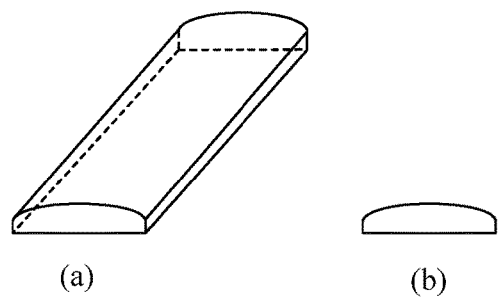

FIGS. 13 to 15 are three-dimensional and sectional structural schematic diagrams of a light regulation portion according to at least one embodiment of the present disclosure. FIGS. 13(a), 14(a) and 15(a) are three-dimensional structural schematic diagrams of the light regulation portion. FIGS. 13(b), 14(b) and 15(b) are sectional schematic diagrams of the light regulation portion. As shown in FIGS. 13(a), 14(a) and 15(a), the light regulation portion may have strip-like structures with different sectional shapes. As shown in FIGS. 13(a) and 13(b), the section of the light regulation portion may be a trapezoid. As shown in FIGS. 14(a) and 14(b), the section of the light regulation portion may be a triangle. As shown in FIGS. 15(a) and 15(b), the section of the light regulation portion may be in a shape with a rectangular bottom and a cambered top surface. Among them, the top surface may be a convex surface. However, no limits are made thereto in this embodiment. For example, the top surface of the light regulation portion may be a concave surface.

In some exemplary implementation modes, when the sectional shape of the light regulation portion is a non-rectangle, it can be seen from thickness and width deduction processes shown in FIGS. 7A and 7B that a thickness of the light regulation portion may be less than or equal to $h_0$, and a width of the light regulation portion may be larger than or equal to a critical width D. For example, as shown in FIG. 13, a thickness of a light regulation portion with a trapezoidal section may be less than or equal to $h_0$, and a length of an upper edge may be larger than or equal to the critical width D. As shown in FIG. 14, a maximum thickness of a light regulation portion with a triangular section may be less than or equal to $h_0$, and a length of a lower edge may be larger than the critical width D. As shown in FIG. 15, a maximum thickness of a light regulation portion whose section has a cambered top surface may be less than or equal to $h_0$, and a minimum width of the light regulation portion may be larger than or equal to a critical width D. However, no limits are made thereto in this embodiment.

The structure of the display substrate of the embodiment of the present disclosure will now be described with reference to FIG. 8 through an example of a preparation process of the display substrate. A "patterning process" mentioned in the present disclosure includes film layer deposition, photoresist coating, masking exposure, development, etching, photoresist stripping, and other treatment. The deposition may be any one or more of sputtering, evaporation, and chemical vapor deposition. The coating may be any one or more of spray coating and spin coating. The etching may be any one or more of dry etching and wet etching. A "thin film" refers to a layer of thin film made of a certain material on an underlaying substrate by a deposition or coating process. If the patterning process is not needed by the "thin film" throughout the preparation process, the "thin film" may also be referred to as a "layer". When a patterning process is further needed by the "thin film" throughout preparation process, the thin film is referred to as a "thin film" before the patterning process and referred to as a "layer" after the patterning process. The "layer" after the patterning process includes at least one "pattern".

That "A and B are arranged in the same layer" mentioned in the present disclosure refers to that A and B are simultaneously formed by the same patterning process. The "same layer" does not always mean that the thickness of the layer or the height of the layer is the same in a sectional view. That "the projection of A includes that of B" refers to that the projection of B falls in a range of the projection of A or the projection of A covers the projection of B.

In some exemplary implementation modes, the preparation process of the display substrate of this embodiment may include the following Step (1) to Step (6). Descriptions are made in this exemplary embodiment taking a flexible display substrate with a top-emission structure as an example.

In Step (1), an underlaying substrate is provided.

In some exemplary implementation modes, the underlaying substrate 101 may be a rigid base substrate such as a quartz base substrate or a glass base substrate, or may be a flexible base substrate such as an organic resin base substrate. However, no limits are made thereto in this embodiment.

In Step (2), a driving structure layer is prepared on the underlaying substrate.

In some exemplary implementation modes, the driving structure layer 102 includes multiple driving circuits. Each of the driving circuits includes multiple transistors and at least one storage capacitor, for example, a 2T1C, 3T1C or 7T1C design is used. As shown in FIG. 8, three sub-pixels are shown as an example, and the pixel driving circuit of each sub-pixel only includes ne transistor 211 and one storage capacitor 210 as an example.

In some exemplary implementation modes, a preparation process of the driving structure layer 102 may refer to the following descriptions. A preparation process of a pixel driving circuit of a first sub-pixel is described as an example.

A first insulating thin film and a semiconductor thin film are sequentially deposited on the underlaying substrate 101.

The semiconductor thin film is patterned through a patterning process to form a first insulating layer 201 covering the entire underlaying substrate 101 and a pattern of a semiconductor layer arranged on the first insulating layer 201. The pattern of the semiconductor layer at least includes an active layer of the transistor 211.

Then, a second insulating thin film and a first metal thin film are sequentially deposited. The first metal thin film is patterned through a patterning process to form a second insulating layer 202 covering the pattern of the semiconductor layer and a pattern of a first gate metal layer arranged on the second insulating layer 202. The pattern of the first gate metal layer at least includes a gate electrode of the transistor 211 and a first capacitor electrode of the storage capacitor 210.

Then, a third insulating thin film and a second metal thin film are sequentially deposited. The second metal thin film is patterned through a patterning process to form a third insulating layer 203 covering the first gate metal layer and a pattern of a second gate metal layer arranged on the third insulating layer 203. The pattern of the second gate metal layer at least includes a second capacitor electrode of the storage capacitor 210. A position of the second capacitor electrode corresponds to a position of the first capacitor electrode.

Then, a fourth insulating thin film is deposited. The fourth insulating thin film is patterned through a patterning process to form a pattern of a fourth insulating layer 204 covering the second gate metal layer. At least two first vias are formed on the fourth insulating layer 204. The fourth insulating layer 204, third insulating layer 203 and second insulating layer 202 in the two first vias are etched off to expose a surface of the active layer.

Then, a third metal thin film is deposited. The third metal thin film is patterned through a patterning process to form a pattern of a source/drain metal layer on the fourth insulating layer 204. The source/drain metal layer at least includes a source electrode and a drain electrode of the transistor 211. The source electrode and the drain electrode may be connected with the active layer through the first vias respectively.

Then, a fifth insulating thin film is coated on the underlaying substrate 101 with the above-mentioned patterns formed to form a fifth insulating layer 205 covering the entire underlaying substrate 101. Multiple second vias are formed in the fifth insulating layer 205 by masking, exposure and development processes. The fifth insulating layer 205 in the multiple second vias is developed away to expose a surface of the drain electrode of the transistor 211 of the pixel driving circuit of the first sub-pixel, a surface of a drain electrode of a corresponding transistor of the pixel driving circuit of the second sub-pixel, and a surface of a drain electrode of a corresponding transistor of the pixel driving circuit of the third sub-pixel.

As shown in FIG. 8, in the pixel driving circuit of the first sub-pixel, the active layer, the gate electrode, the source electrode and the drain electrode may form the transistor 211, and the first capacitor electrode and the second capacitor electrode may form the storage capacitor 210. In the above-mentioned preparation process, the pixel driving circuit of the second sub-pixel and the pixel driving circuit of the third sub-pixel may be formed at the same time.

In some exemplary implementation modes, the first insulating layer 201, the second insulating layer 202, the third insulating layer 203 and the fourth insulating layer 204 are made of any one or more of silicon oxide (SiOx), silicon nitride (SiNx), and silicon oxynitride (SiON), and may be in a single-layer, multi-layer, or a composite layer. The first insulating layer 201 is referred to as a buffer layer and used to improve water and oxygen resistance capability of the underlaying substrate. The second insulating layer 202 and the third insulating layer 203 are referred to as Gate Insulator (GI) layers. The fourth insulating layer 204 is referred to as an Interlayer Dielectric (ILD) layer. The fifth insulating layer 205 may be made of an organic material, such as polyimide, acrylic, or polyethylene terephthalate. The fifth insulating layer 205 is referred to as a Planarization (PLN) layer. The first metal thin film, the second metal thin film and the third metal thin film are made of metal materials, such as any one or more of Argentum (Ag), Copper (Cu), Aluminum (Al), Titanium (Ti), and Molybdenum (Mo), or alloy materials of the above-mentioned metals, such as an Aluminum-Neodymium alloy (AlNd) or a Molybdenum-Niobium alloy (MoNb), and may be in a single-layer structure, or a multilayer composite structures such as Ti/Al/Ti. The semiconductor thin film is made of one or more materials such as amorphous indium gallium zinc oxide (a-IGZO), zinc oxynitride (ZnON), indium zinc tin oxide (IZTO), amorphous silicon (a-Si), polysilicon (p-Si), sexithiophene, and polythiophene. That is, the present disclosure is applicable to a transistor manufactured based on an oxide technology, a silicon technology, and an organic matter technology.

In Step (3), a light-emitting element is formed on the underlaying substrate with the above-mentioned patterns formed.

In some exemplary implementation modes, a conductive thin film is deposited on the underlaying substrate 101 with the above-mentioned structures formed. The conductive thin film is patterned through a patterning process to form a pattern of a first electrode layer. The first electrode layer includes multiple first electrodes. In some examples, the first electrodes are reflective anodes. As shown in FIG. 8, a first electrode 301a of the first sub-pixel is connected with the drain electrode of the transistor 211 through a second via. A first electrode 301b of the second sub-pixel is connected with a drain electrode of a transistor corresponding to the pixel driving circuit of the second sub-pixel through a second via. A first electrode 301c of the third sub-pixel is connected with a drain electrode of a transistor corresponding to the pixel driving circuit of the third sub-pixel through a second via.

In some examples, the first electrodes may be made of a metal material, such as any one or more of Magnesium (Mg), Argentum (Ag), Copper (Cu), Aluminum (Al), Titanium (Ti) and Molybdenum (Mo), or alloy materials of the above-mentioned metals, such as an Aluminum-Neodymium alloy (AlNd) or a Molybdenum-Niobium alloy (MoNb), and may be of single-layer structures, or multilayer composite structures such as Ti/Al/Ti, or stacked structures formed by metals and transparent conductive materials such as Indium Tin Oxide (ITO)/Ag/ITO, Mo/AlNd/ITO and other reflective materials.

In some exemplary implementation modes, the underlaying substrate 101 with the above-mentioned patterns formed is coated with a pixel definition thin film. A pattern of a Pixel Definition Layer (PDL) is formed by masking, exposure and development processes. As shown in FIG. 8, the pixel definition layer 302 in a display region includes multiple pixel definition layer openings. The pixel definition layer in the multiple pixel definition layer openings is developed away to at least partially expose a surface of the first electrode 301a of the first sub-pixel, a surface of the first electrode 301b of the second sub-pixel, and a surface of the first electrode 301c of the third sub-pixel.

In some examples, the pixel definition layer 302 may be made of polyimide, acrylic, or polyethylene terephthalate.

In some exemplary implementation modes, the underlaying substrate 101 with the above-mentioned patterns formed is coated with an organic material thin film. A pattern of a spacer posts is formed by masking, exposure and development processes. The spacer posts may be arranged as a support layer to support a Fine Metal Mask (FMM) in an evaporation process.

In some exemplary implementation modes, an organic light-emitting layer and a second electrode are sequentially formed on the underlaying substrate 101 with the above-mentioned patterns formed. In some examples, the second electrode is a transparent cathode. The light-emitting element may emit light from a side away from the underlaying substrate 101 through the transparent electrode so as to achieve top emission. In some examples, the organic light-emitting layer of the light-emitting element includes a hole injection layer, a hole transport layer, an electron block layer, an emitting layer, a hole block layer, an electron transport layer, and an electron injection layer.

In some exemplary implementation modes, the hole injection layer, the hole transport layer and the electron block layer are sequentially formed by evaporation with an open mask on the underlaying substrate 101 with the above-mentioned patterns formed. A thickness of the hole injection layer is about 0 to 20 nm. A thickness of the hole transport layer is about 70 nm to 200 nm. A thickness of the electron block layer is about 10 nm to 70 nm. Then, emitting layers of different colors, such as a blue emitting layer, a green emitting layer, and a red emitting layer, are sequentially formed by evaporation with an FMM. In some examples, a thickness of the emitting layer is about 10 nm to 50 nm. Then, the hole block layer, the electron transport layer and the electron injection layer are sequentially formed by evaporation with an open mask. A thickness of the hole block layer is about 0 to 20 nm. A thickness of the electron transport layer is about 10 nm to 50 nm. A thickness of the electron injection layer is about 0 to 5 nm. However, no limits are made thereto in this embodiment.

In some exemplary implementation modes, the organic light-emitting layer is formed in a sub-pixel region and connected with the first electrodes. The second electrode 304 is formed on the pixel definition layer 302 and connected with the organic light-emitting layer.

In some exemplary implementation modes, the second electrode may be made of any one or more of Magnesium (Mg), Argentum (Ag) and Aluminum (Al), or an alloy made of any one or more of the above-mentioned metals, or a transparent conductive material such as Indium Tin Oxide (ITO), or may be in a multilayer composite structure of metals and transparent conductive materials. For example, a ratio of magnesium to argentum in the second electrode may be about 1:9 to 8:2. A thickness of the second electrode may be about 5 nm to 30 nm. However, no limits are made thereto in this embodiment.

In some exemplary implementation modes, an optical coupling layer may be formed at a side of the second electrode 304 away from the underlaying substrate 101. The optical coupling layer may be an intercommunicated layer of multiple sub-pixels. The optical coupling layer may be matched with the transparent electrode so as to increase a light output. For example, a material of the optical coupling layer may be a semiconductor material. However, no limits are made thereto in this embodiment.

In (4), an encapsulation layer is formed on the underlaying substrate with the above-mentioned patterns formed.

In some exemplary implementation modes, the encapsulation layer 104 is formed on the underlaying substrate 101 with the above-mentioned patterns formed. The encapsulation layer 104 may include a first encapsulation layer, a second encapsulation layer and a third encapsulation layer which are stacked. The first encapsulation layer is made of an inorganic material, and covers the second electrode 304 in the display region. The second encapsulation layer is made of an organic material. The third encapsulation layer is made of an inorganic material, and covers the first encapsulation layer and the second encapsulation layer. However, no limits are made thereto in this embodiment. In some examples, the encapsulation layer made be of an inorganic/organic/inorganic/organic/inorganic five-layer structure.

In (5), a black matrix, a light regulation layer and color filter units are sequentially formed on the underlaying substrate with the above-mentioned patterns formed.

In some exemplary implementation modes, a surface of the encapsulation layer 104 is coated with a black pigment or deposited with a black Chromium (Cr) thin film. The black pigment or the black chromium thin film is patterned through a patterning process to form the black matrix 501 on the encapsulation layer 104. The black matrix 501 is provided with multiple openings. The black matrix in the multiple openings is removed to expose opening regions of multiple sub-pixels. Then, a surface of the black matrix 501 is coated with a light regulation material. The light regulation layer 106 is formed on the black matrix 501 by masking, exposure and development processes. In some examples, the light regulation material may be a negative-refractive-index material, such as a photonic crystal material or a dual-dielectric negative-refractive-index material. Then, multiple first color filter units (such as red filter units), multiple second color filter units (such as green filter units) and multiple third color filter units (such as blue filter units) are sequentially formed. Taking the formation of the red filter unit as an example, the encapsulation layer 104 with the black matrix 501 and the light regulation layer 106 formed is coated with a red resin at first, and the red filter units are formed by masking, exposure and development after baking-curing. The green filter units and the blue filter units are formed through similar processes, which will not be repeated herein. In this exemplary implementation mode, the light regulation layer is formed between the formed color filter units so as to avoid the influence of a preparation process of the light regulation layer on the color filter units.

In (6), a planarization layer 107 and a cover layer 108 are sequentially formed on the underlaying substrate with the above-mentioned patterns formed.

According to the display substrate provided in this exemplary embodiment, the light regulation layer is formed on the black matrix to adjust emergent directions of light of different colors, so as to improve the view angle color shift of the display substrate.

The structure of the display substrate of the embodiment of the present disclosure and the preparation process thereof are described only as an example. In some exemplary implementation modes, changes in corresponding structures and addition or deletion of the patterning process may be made as practically required. For example, the display substrate may be a display substrate of a bottom-emission structure. For another example, the display structure layer may include two source/drain metal layers. For another example, after the black matrix is formed, the color filter units may be prepared at first, and then the light regulation layer is formed. However, no limits are made thereto in this embodiment.

Figure 16:
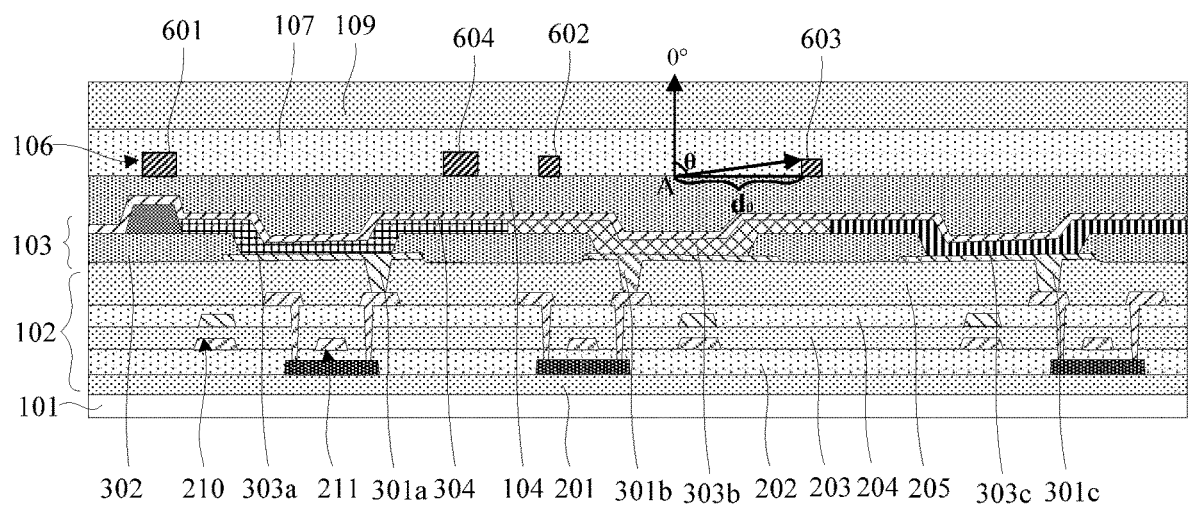
FIG. 16 is another schematic structural diagram of a display substrate according to at least one embodiment of the present disclosure.

FIG. 16 is a schematic diagram of another structure of a display substrate according to at least one embodiment of the present disclosure. As shown in FIG. 16, in a plane perpendicular to the display substrate, the display substrate includes an underlaying substrate 101, and a display structure layer, am encapsulation layer 104, dimming light regulation layer 106, a planarization layer 107 and a polarizer 109 which are sequentially arranged on the underlaying substrate 101. The display structure layer includes a driving structure layer 102 and a light-emitting structure layer 103 which are sequentially arranged on the underlaying substrate 101. In this exemplary implementation mode, the light regulation layer 106 is located on the encapsulation layer 104, and is configured to adjust emergent directions of light of different colors emitted by sub-pixels. The light regulation layer 106 may include multiple light regulation portions, such as a first light regulation portion 601 to a fourth light regulation portion 604. In some examples, the first light regulation portion 601 and the fourth light regulation portion 604 are configured to adjust an emergent direction of red light emitted by a red sub-pixel. The second light regulation portion 602 and the third light regulation portion 603 are configured to adjust an emergent direction of green light emitted by a green sub-pixel. However, no limits are made thereto in this embodiment.

Related structures of the display substrate of this embodiment and the principle of adjusting emergent directions of light by the light regulation layer may refer to the descriptions in the above-mentioned embodiments, which will not be repeated herein. The structure (or method) shown in this implementation mode may be combined with structures (or methods) shown in other implementation modes as appropriate.

At least one embodiment of the present disclosure further provides a method for preparing a display substrate, which is used for preparing the display substrate as described in the above-mentioned embodiments. The preparation method of this embodiment includes that: a display structure layer is formed on an underlaying substrate; and a light regulation layer is formed at a light exiting side of the display structure layer. The display structure layer includes multiple sub-pixels. An orthographic projection of the light regulation layer on the underlaying substrate does not overlap with opening regions of the multiple sub-pixels. The light regulation layer is configured to adjust an emergent direction of light of at least one color emitted from the display structure layer.

The preparation method of this embodiment may refer to the descriptions in the above-mentioned embodiments, and thus will not be repeated herein.

Figure 17:
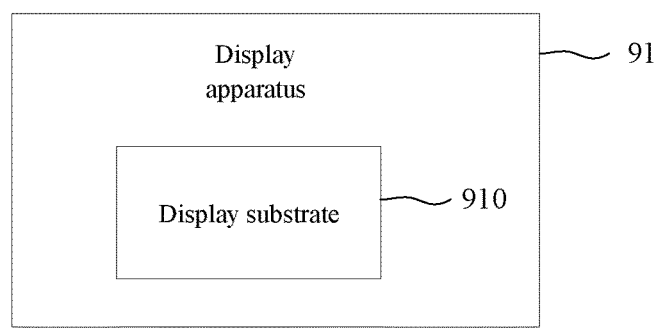
FIG. 17 is a schematic diagram of a display apparatus according to at least one embodiment of the present disclosure.

FIG. 17 is a schematic diagram of a display apparatus according to at least one embodiment of the present disclosure. As shown in FIG. 17, this embodiment provides a display apparatus 91, which includes a display substrate 910. The display substrate 910 is the display substrate provided in the above-mentioned embodiments. In some examples, the display substrate 910 may be an OLED display substrate. The display apparatus 91 may be any product or component with a display function, such as an OLED display apparatus, a mobile phone, a tablet computer, a television, a display, a laptop computer, a digital photo frame, a navigator, a vehicle-mounted display, a watch, and a wristband. However, no limits are made thereto in this embodiment.

Figure 18:
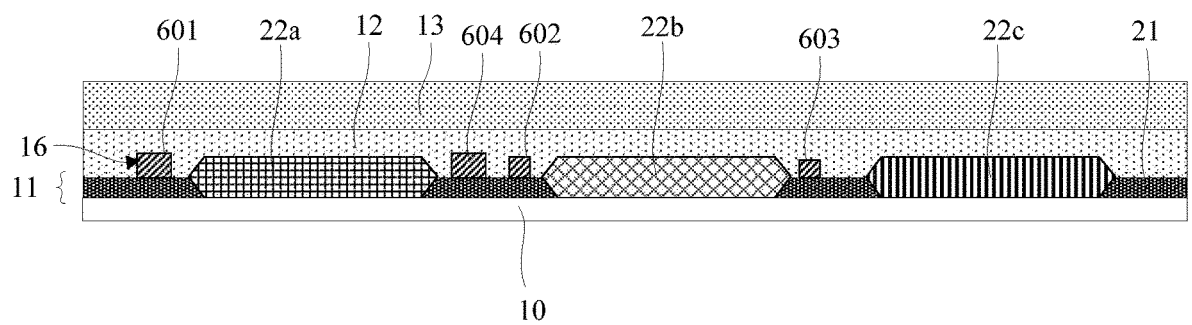
FIG. 18 is a schematic diagram of a color film substrate according to at least one embodiment of the present disclosure.

FIG. 18 is a schematic diagram of a color film substrate according to at least one embodiment of the present disclosure. As shown in FIG. 18, in a plane perpendicular to the color film substrate, the color film substrate includes a base substrate 10, a color filter layer 11 and dimming light regulation layer 16 which are arranged on the base substrate 10, and a planarization layer 12 and a cover layer 13 which are located at a side of the light regulation layer 16 away from the base substrate 10. The color filter layer 11 includes a black matrix 21 and multiple color filter units which are periodically arranged, such as a first color filter unit 22a, a second color filter unit 22b, and a third color filter unit 22c. The light regulation layer 16 is arranged on the black matrix 21. An orthographic projection of the light regulation layer 16 on the base substrate 10 is located within that of the black matrix 21 on the base substrate 10, and does not overlap that of the color filter units on the base substrate 10. The light regulation layer 16 is configured to adjust an emergent direction of light of at least one color emitted from the color filter layer 11. In some examples, the light regulation layer 16 may include a first light regulation portion 601, a second light regulation portion 602, a third light regulation portion 603, and a fourth light regulation portion 604. The first light regulation portion 601 and the fourth light regulation portion 604 are located at two opposite sides of the first color filter unit 22a, and are configured to adjust an emergent direction of first-color light emitted from the first color filter unit 22a. The second light regulation portion 602 and the third light regulation portion 603 are located at two opposite sides of the second color filter unit 22b, and are configured to adjust an emergent direction of second-color light emitted from the second color filter unit 22b. In some examples, the first color filter unit 22a is a red filter unit, the second color filter unit 22b is a green filter unit, and the third color filter unit 22c is a blue filter unit. However, no limits are made thereto in this embodiment.

Descriptions about the light regulation layer in this embodiment may refer to those in the above-mentioned embodiments, which will not be repeated herein. The structure (or method) shown in this implementation mode may be combined with structures (or methods) shown in other implementation modes as appropriate.

In some exemplary implementation modes, the color film substrate of this embodiment may be arranged at a light exiting side of the OLED display substrate. Alternatively, the color film substrate of this embodiment may be aligned with an array substrate to form a display panel. However, no limits are made thereto in this embodiment.

The color film substrate provided in this embodiment may adjust emergent directions of light of different colors by use of the light regulation layer, thereby improving a display view angle color shift.

The drawings of the present disclosure only involve the structures involved in the present disclosure, and the other structures may refer to conventional designs. The embodiments in the present disclosure, i.e., the features in the embodiments, may be combined with each other to obtain new embodiments if there is no conflict.

Those of ordinary skills in the art should know that modifications or equivalent replacements may be made to the technical solutions of the present disclosure without departing from the spirit and scope of the technical solutions of the present disclosure, and shall all fall within the scope of the claims of the present application.

The invention claimed is:

1. A display substrate, comprising:
   an underlaying substrate, a display structure layer arranged on the underlaying substrate, and a light regulation layer arranged at a light exiting side of the display structure layer, wherein the display structure layer comprises a plurality of sub-pixels;
   an orthographic projection of the light regulation layer on the underlaying substrate does not overlap with opening regions of the plurality of sub-pixels; and
   the light regulation layer is configured to adjust an emergent direction of light of at least one color emitted from the display structure layer.

2. The display substrate according to claim 1, wherein the display structure layer further comprises a color filter layer located at a light exiting side of the plurality of sub-pixels, the color filter layer comprises a black matrix and a plurality of color filter units which are periodically arranged, and the black matrix is located between adjacent color filter units; and
   the light regulation layer is located at a side of the black matrix away from the underlaying substrate.

3. The display substrate according to claim 2, wherein an orthogonal projection of the black matrix on the underlaying substrate covers an orthogonal projection of the light regulation layer on the underlaying substrate.

4. The display substrate according to claim 2, wherein the light regulation layer comprises at least one light regulation portion, and the at least one light regulation portion is located on at least one side of at least one of the color filter units.

5. The display substrate according to claim 4, wherein a brightness ratio of light of different colors of the display substrate at a target view angle is adjusted by at least one of the following: a distance from the light regulation portion to a corresponding sub-pixel, a first length of the light regulation portion, and a second length of the light regulation portion;
   the first length is a size of the light regulation portion in a first direction, wherein the first direction is perpendicular to a plane where the display substrate is located; and
   the second length is a size of the light regulation portion in a second direction, wherein the second direction is parallel to the plane where the display substrate is located and intersected with a centerline of the sub-pixel corresponding to the light regulation portion.

6. The display substrate according to claim 5, wherein the first length of the light regulation portion is less than or equal to $h_0$, $h_0-d_0/\tan\theta$, where $d_0$ represents a vertical distance from the light regulation portion to the centerline of the corresponding sub-pixel, and $\theta$ represents a squint angle.

7. The display substrate according to claim 5, wherein the second length of the light regulation portion is larger than or equal to a critical width D, $$D = \frac{d_0}{\tan\theta \tan\left\{\arcsin\left[\frac{n_1}{n_2}\sin\left(\frac{\pi}{2}-\theta\right)\right]\right\}},$$

where $d_0$ represents a vertical distance from the light regulation portion to the centerline of the corresponding sub-pixel, $\theta$ represents a squint angle, $n_1$ represents a refractive index of a first medium, and $n_2$ represents a refractive index of the light regulation portion.

8. The display substrate according to claim 6, wherein the vertical distance from the light regulation portion to the centerline of the corresponding sub-pixel is $d_0=a_1/2+d$, where $a_1$ represents a size of the sub-pixel corresponding to the light regulation portion, and d represents a distance from the light regulation portion to the corresponding sub-pixel, and d is larger than 0 and smaller than a difference between a distance between adjacent sub-pixels and a second length of a light regulation portion between the adjacent sub-pixels.

9. The display substrate according to claim 5, wherein, in a plane crossing the centerline of the sub-pixel corresponding to the light regulation portion and perpendicular to the underlaying substrate, a section of the light regulation portion is a rectangle, or, a second length of a bottom of the light regulation portion is larger than a second length of a top of the light regulation portion.

10. The display substrate according to claim 2, wherein the color filter layer comprises a first color filter unit, a second color filter unit and a third color filter unit which are periodically arranged; and
    the light regulation layer comprises at least one of the following: a first light regulation portion located at a side of the first color filter unit away from the second color filter unit, a fourth light regulation portion located at a side of the first color filter unit close to the second color filter unit, a second light regulation portion located at a side of the second color filter unit close to the first color filter unit, and a third light regulation portion located at a side of the second color filter unit close to the third color filter unit.

11. The display substrate according to claim 10, wherein the second light regulation portion and the fourth light regulation portion form an integrated structure.

12. The display substrate according to claim 11, wherein a second length of the integrated structure formed by the second light regulation portion and the fourth light regulation portion is larger than or equal to the maximum among a critical width of the second light regulation portion and a critical width of the fourth light regulation portion; and
    the second length is a size of the light regulation portion in a second direction, wherein the second direction is parallel to a plane where the display substrate is located and intersected with a centerline of a sub-pixel corresponding to the light regulation portion.

13. The display substrate according to claim 10, wherein the first color filter unit is a red filter unit, the second color filter unit is a green filter unit, and the third color filter unit is a blue filter unit;
    the first light regulation portion and the fourth light regulation portion are configured to adjust an emergent direction of first-color light emitted from the first color filter unit; the second light regulation portion and the third light regulation portion are configured to adjust an emergent direction of second-color light emitted from the second color filter unit; and
    a first length of each of the first light regulation portion and the fourth light regulation portion is larger than or equal to a first length of the second light regulation portion and is also larger than or equal to a first length of the third light regulation portion, wherein the first length is a size of a light regulation portion in a first direction, and the first direction is perpendicular to a plane where the display substrate is located.

14. The display substrate according to claim 13, wherein the first lengths of the first light regulation portion and the fourth light regulation portion are about 0.7 microns to 1.2 microns, the first length of the second light regulation portion is about 0.1 microns to 0.5 microns, and the first length of the third light regulation portion is about 0.01 microns to 0.3 microns.

15. The display substrate according to claim 13, wherein second lengths of the first light regulation portion, the second light regulation portion, the third light regulation portion and the fourth light regulation portion are substantially the same; and the second length is a size of a light regulation portion in a second direction, wherein the second direction is parallel to the plane where the display substrate is located and intersected with a centerline of a sub-pixel corresponding to the light regulation portion.

16. The display substrate according to claim 1, wherein a material of the light regulation layer is a negative-refractive-index material.

17. The display substrate according to claim 1, wherein a sub-pixel comprises a light-emitting element and a driving circuit for driving the light-emitting element to emit light; the light-emitting element comprises a first electrode, a second electrode, and an organic light-emitting layer arranged between the first electrode and the second electrode, the first electrode is located at a side of the second electrode close to the underlaying substrate, and an inclination angle is formed between a plane where the first electrode is located and a plane where the underlaying substrate is located.

18. A display apparatus, comprising the display substrate according to claim 1.

19. A method for preparing a display substrate, used for preparing the display substrate according to claim 1 and comprising:

forming a display structure layer on an underlaying substrate, wherein the display structure layer comprises a plurality of sub-pixels; and forming a light regulation layer at a light exiting side of the display structure layer, wherein an orthographic projection of the light regulation layer on the underlaying substrate does not overlap with opening regions of the plurality of sub-pixels, and the light regulation layer is configured to adjust an emergent direction of light of at least one color emitted from the display structure layer.

* * * * *